(12) United States Patent
Baldwin

(10) Patent No.: US 10,387,982 B2
(45) Date of Patent: Aug. 20, 2019

(54) DETERMINING AVAILABLE STORAGE CAPACITY OF A VEHICLE

(71) Applicant: Lyft, Inc., San Francisco, CA (US)

(72) Inventor: Christopher Baldwin, Algonquin, IL (US)

(73) Assignee: Lyft, Inc., San Francisco, CA (US)

( * ) Notice: Subject to any disclaimer, the term of this patent is extended or adjusted under 35 U.S.C. 154(b) by 267 days.

(21) Appl. No.: 15/475,071

(22) Filed: Mar. 30, 2017

(65) Prior Publication Data

US 2017/0206293 A1 Jul. 20, 2017

Related U.S. Application Data

(63) Continuation of application No. 14/042,137, filed on Sep. 30, 2013, now Pat. No. 9,639,909.

(51) Int. Cl.
| | | |
|---|---|---|
| *G06Q 50/28* | (2012.01) | |
| *G01B 11/28* | (2006.01) | |
| *H04W 4/80* | (2018.01) | |
| *G06F 16/951* | (2019.01) | |
| *B60R 5/00* | (2006.01) | |
| *H04W 4/04* | (2009.01) | |
| *G06F 17/50* | (2006.01) | |

(Continued)

(52) U.S. Cl.
CPC ............ *G06Q 50/28* (2013.01); *B60R 5/00* (2013.01); *G01B 11/28* (2013.01); *G06F 16/951* (2019.01); *G06F 17/5009* (2013.01); *G06N 7/005* (2013.01); *H04W 4/046* (2013.01); *H04W 4/80* (2018.02); *H04L 67/10* (2013.01)

(58) Field of Classification Search
CPC ........ G06Q 50/28; B65G 60/00; B65G 67/00; G01B 11/28; B60R 5/00

USPC ........................................... 701/1, 36; 703/6
See application file for complete search history.

(56) References Cited

U.S. PATENT DOCUMENTS

| | | |
|---|---|---|
| 5,042,015 A | 8/1991 | Stringer |
| 5,943,295 A | 8/1999 | Varga et al. |

(Continued)

OTHER PUBLICATIONS

Samuel et al., "Visual identification system for homeland security and law enforcement support," Nondestructive Evaulation for Health Monitoring and Diagnostics, International Society for Optics and Photonics, 2005. Proceedings of SPIE vol. 5769 (SPIE. Bellingham, WA, 2005)—0277-786X/05/$15—doi: 10.1117/12.606663. [http://proceedings.spiedigitallibrary.org/] Retrieved on Aug. 8, 2013, 13 pages.

(Continued)

*Primary Examiner* — Isaac G Smith
(74) *Attorney, Agent, or Firm* — FishBroyles LLP

(57) ABSTRACT

Tracking remaining storage capacity of a vehicle using sensors via a wireless system of the vehicle is presented herein. A method can include receiving first data representing an object; receiving second data representing a storage space of a vehicle; and determining, using the first data and the second data, whether the object is capable of placement within the storage space of the vehicle. In an example, the method can further include displaying information representing an order of placements of a set of objects comprising the object, a proposed location for the object, and/or a proposed orientation for the object within the storage space of the vehicle in response to the object being determined to be capable of placement within the storage space of the vehicle.

20 Claims, 18 Drawing Sheets

(51) Int. Cl.
*G06N 7/00* (2006.01)
*H04L 29/08* (2006.01)

(56) References Cited

U.S. PATENT DOCUMENTS

| | | | |
|---|---|---|---|
| 6,437,702 B1 | 8/2002 | Ragland et al. | |
| 6,958,451 B2 | 10/2005 | Breed et al. | |
| 7,250,865 B2 | 7/2007 | Maloney | |
| 7,421,112 B2 | 9/2008 | Calver et al. | |
| 7,463,184 B2 | 12/2008 | Segawa | |
| 7,468,660 B2 | 12/2008 | Griffin et al. | |
| 7,477,758 B2 | 1/2009 | Piirainen et al. | |
| 7,499,802 B2 | 3/2009 | Mishima et al. | |
| 7,579,941 B2 | 8/2009 | Cleveland et al. | |
| 7,738,678 B2 | 6/2010 | Breed et al. | |
| 7,746,379 B2 | 6/2010 | Jesson et al. | |
| 8,457,881 B2 | 6/2013 | Ishihara | |
| 9,315,344 B1 * | 4/2016 | Lehmann | G06Q 10/08 |
| 2006/0167595 A1 | 7/2006 | Breed et al. | |
| 2011/0068954 A1 | 3/2011 | McQuade et al. | |
| 2012/0035846 A1 | 2/2012 | Sakamoto et al. | |
| 2012/0053785 A1 | 3/2012 | Wittorf | |
| 2012/0259509 A1 | 10/2012 | Wittorf | |
| 2013/0293539 A1 | 11/2013 | Hunt et al. | |
| 2014/0343910 A1 * | 11/2014 | Zheng | G06F 17/5009 703/6 |

OTHER PUBLICATIONS

Wood, et al., "Covert camera for screening of vehicle interiors and HOV enforcement," AeroSense 2003, International Society for Optics and Photonics, 2003. Proceedings of SPIE vol. 5071 (2003) (c) 2003 SPIE—0277-786X/03/$15.00. [http://proceedings.spiedigitallibrary.org/] Retrieved on Aug. 8, 2013, 10 pages.

Office Action for U.S. Appl. No. 14/042,137 dated Oct. 30, 2015, 44 pages.

Office Action for U.S. Appl. No. 14/042,137 dated Apr. 30, 2015, 35 pages.

Office Action for U.S. Appl. No. 14/042,137 dated Jun. 30, 2016, 57 pages.

* cited by examiner

DETERMINING AVAILABLE STORAGE CAPACITY OF A VEHICLE

RELATED APPLICATION

The subject application claims priority to U.S. patent application Ser. No. 14/042,137, filed Sep. 30, 2013, and entitled "DETERMINING AVAILABLE STORAGE CAPACITY OF A VEHICLE," the entirety of which application is hereby incorporated by reference herein.

TECHNICAL FIELD

The subject application relates to determining storage capacity, e.g., determining an available storage capacity of a vehicle.

BACKGROUND

People desire to efficiently and safely store objects in vehicles, for example, during travel, after purchasing goods such as furniture, electronic devices, groceries, etc. However, conventional vehicle technologies have some drawbacks with respect to storage of objects within vehicles.

BRIEF DESCRIPTION OF THE DRAWINGS

Non-limiting embodiments of the subject disclosure are described with reference to the following figures, wherein like reference numerals refer to like parts throughout the various views unless otherwise specified.

DETAILED DESCRIPTION

Figure 1:
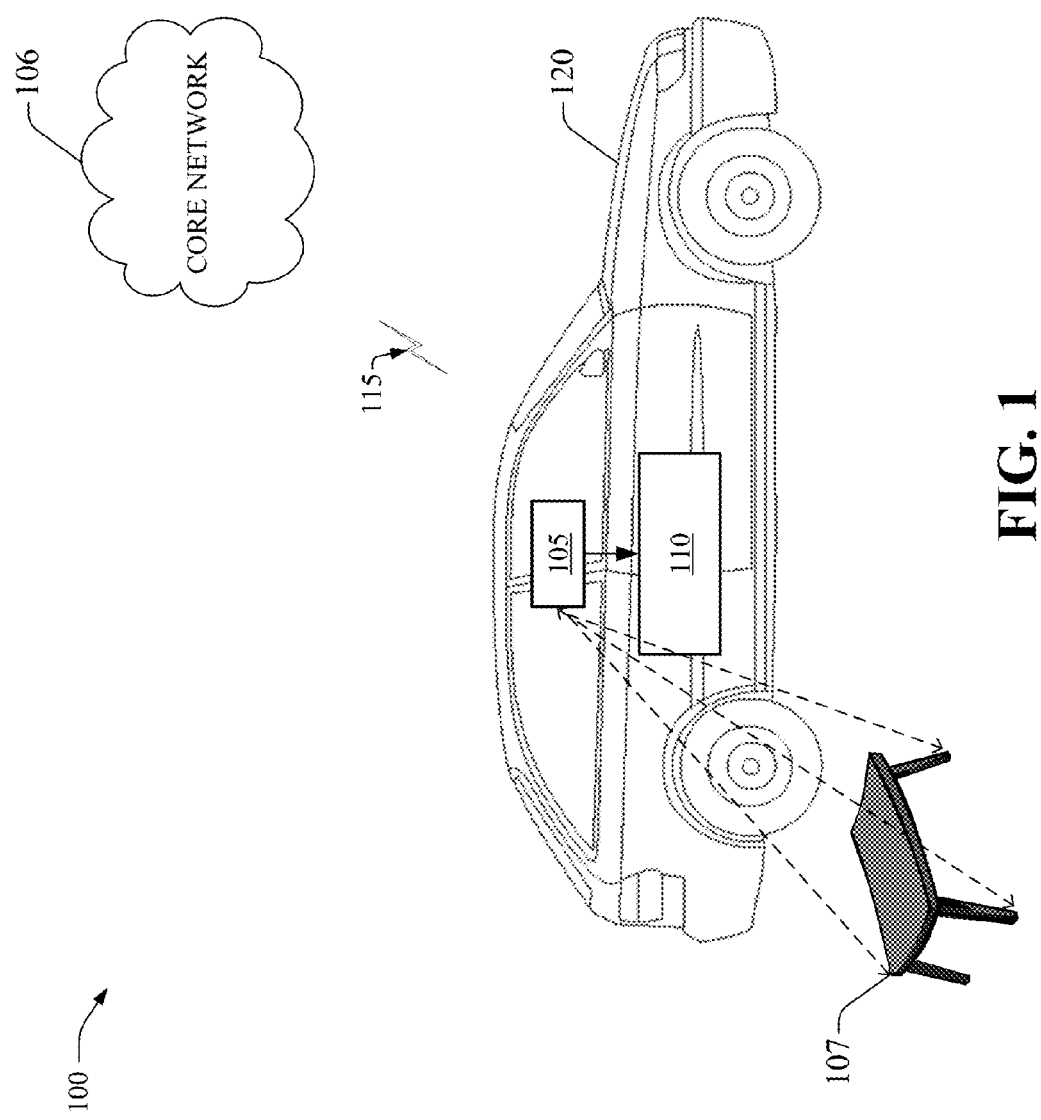
FIG. 1 illustrates a block diagram of a vehicle environment, in accordance with various embodiments.

Aspects of the subject disclosure will now be described more fully hereinafter with reference to the accompanying drawings in which example embodiments are shown. In the following description, for purposes of explanation, numerous specific details are set forth in order to provide a thorough understanding of the various embodiments. However, the subject disclosure may be embodied in many different forms and should not be construed as limited to the example embodiments set forth herein.

People increasingly desire to efficiently and safely store objects in their vehicles, for example, during vacations, trips to college, moving, etc. Further, people are willing to devote more time to packing and/or trying to pack objects, e.g., furniture, electronics, groceries, etc. into their cars as they increasingly desire to avoid delays and costs associated with delivery of such objects. Various embodiments disclosed herein can simplify the loading of objects in vehicles, coordinate multi-object packing, and inform user's about incompatible storage of objects to maximize space utilization, minimize the risk of damaging objects, and improve consumer experiences. In this regard, such embodiments can enable a wirelessly connected vehicle, car, etc. to track, determine, predict, etc. remaining storage capacity of the wirelessly connected vehicle using sensors/components, e.g. interior cameras, exterior cameras, etc.

For example, a method can receive, by a system, e.g., a wireless communications device of the vehicle, data representing an object, e.g., potential cargo of the vehicle. In an embodiment, such data can describe a size of the object, dimension(s) of the object, a weight of the object, whether the object is fragile, etc. In another embodiment, the method can receive such data via one or more sensors, e.g., a camera, an imaging device, etc. of the vehicle that can monitor, scan, etc. an external environment of the vehicle including the object. In yet another embodiment, the method can receive such data, e.g., via a cloud-based, e.g., Internet based, data store that correlates information representing the object with characteristics of the object, for example, in response to a scan of information representing the object, e.g., a barcode, radio-frequency identification (RFID) tag, a near field communication (NFC) tag, etc. associated with the object, e.g., before the object is purchased, while the object is being purchased, etc.

In another embodiment, the method can receive, via the wireless communications device, other data representing a storage space of the vehicle. In an embodiment, the method can receive the other data via sensor(s), e.g., a camera, an imaging device, etc. of the vehicle, and such data can represent a size, a location, dimension(s), etc. of the storage space, an available storage space, etc. of the vehicle. Further, the method can determine, based on the received data, whether the object is capable of placement, storage, etc. within the storage space of the vehicle.

In one embodiment, the method can display, by the wireless communications device, information representing a proposed location, a candidate location, etc. for the object within the storage space of the vehicle, e.g., in response to the object being determined to be capable of placement within the storage space of the vehicle. For example, the method can display the information representing the proposed location, project an image representing the proposed location, etc. utilizing a display device, e.g., a video output device, a holographic based device, a laser imaging based device, a light projecting device, etc.

In another embodiment, the method can determine, based on the received data, a proposed orientation for the object within the storage space of the vehicle. Further, the method can display, using the display device, information representing the proposed orientation for the object within the storage space of the vehicle.

In yet another embodiment, the method can determine, based on the received data, an order of placements of a set of objects including the object within the storage space of the vehicle in response to the object being determined to be capable of placement within the storage space of the vehicle.

In one embodiment, a system of a vehicle can include an object analysis component configured to determine a characteristic, e.g., a size, a dimension, a center of gravity, a weight, a fragility, a packing classification, etc. of the object. In an embodiment, the object analysis component can be configured to receive, via a sensor of the vehicle, data representing the characteristic of the object. In another embodiment, the object analysis component can be configured to receive the data representing the characteristic in response to a scan of information representing the object, e.g., a barcode, an RFID tag, an NFC tag, a label, etc. associated with the object, e.g., before the object is purchased, while the object is being purchased, etc.

Further, the system can include a capacity management component configured to determine a storage capacity of the vehicle. In an embodiment, the capacity management component can be configured to receive, via another sensor of the vehicle, data representing a storage space of the vehicle, and determine the storage capacity based on the data. Furthermore, the capacity management component can be configured to determine, based on the storage capacity and the characteristic of the object, whether the object is capable of storage within the vehicle.

In another embodiment, the capacity management component can be configured to determine a candidate location for the object within the storage space of the vehicle in response to the object being determined to be capable of storage within the vehicle. Further, a notification component can be configured to display information representing the candidate location, e.g., via a laser projection device, etc.

In yet another embodiment, the capacity management component can be configured to determine a candidate orientation for the object within the storage space of the vehicle. Further, in response to the object being determined to be capable of storage within the vehicle, the notification component can be configured to display information representing the candidate orientation.

In one embodiment, the capacity management component can be configured to determine an order of placements for a set of objects including the object within the storage space of the vehicle in response to the object being determined to be capable of storage within the vehicle. Further, the notification component can be configured to display information representing the order of placements for the set of objects.

Another embodiment can include a computer-readable storage device comprising executable instructions that, in response to execution, cause a system comprising a processor to perform operations, comprising: receiving first data representing a characteristic of an object; receiving second data representing a storage area of a vehicle; and determining, based on the first data and the second data, whether the object is capable of placement within the storage area of the vehicle.

Further, the operations can include receiving the first data via a sensor of the vehicle, receiving the second data via another sensor of the vehicle, and/or displaying information representing a candidate location for the object within the storage area in response to determining that the object is capable of placement within the storage area of the vehicle.

Reference throughout this specification to "one embodiment," or "an embodiment," means that a particular feature, structure, or characteristic described in connection with the embodiment is included in at least one embodiment. Thus, the appearances of the phrase "in one embodiment," or "in an embodiment," in various places throughout this specification are not necessarily all referring to the same embodiment. Furthermore, the particular features, structures, or characteristics may be combined in any suitable manner in one or more embodiments.

Furthermore, to the extent that the terms "includes," "has," "contains," and other similar words are used in either the detailed description or the appended claims, such terms are intended to be inclusive—in a manner similar to the term "comprising" as an open transition word—without precluding any additional or other elements. Moreover, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

As utilized herein, terms "component," "system," "interface," and the like are intended to refer to a computer-related entity, hardware, software (e.g., in execution), and/or firmware. For example, a component can be a processor, a process running on a processor, an object, an executable, a program, a storage device, and/or a computer. By way of illustration, an application running on a server and the server can be a component. One or more components can reside within a process, and a component can be localized on one computer and/or distributed between two or more computers.

Further, components can execute from various computer readable media having various data structures stored thereon. The components can communicate via local and/or remote processes such as in accordance with a signal having one or more data packets (e.g., data from one component interacting with another component in a local system, distributed system, and/or across a network, e.g., the Internet, with other systems via the signal).

As another example, a component can be an apparatus with specific functionality provided by mechanical parts operated by electric or electronic circuitry; the electric or electronic circuitry can be operated by a software application or a firmware application executed by one or more processors; the one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Aspects of systems, apparatus, and processes explained herein can constitute machine-executable instructions embodied within a machine, e.g., embodied in a computer readable medium (or media) associated with the machine. Such instructions, when executed by the machine, can cause the machine to perform the operations described. Additionally, the systems, processes, process blocks, etc. can be embodied within hardware, such as an application specific integrated circuit (ASIC) or the like. Moreover, the order in which some or all of the process blocks appear in each process should not be deemed limiting. Rather, it should be understood by a person of ordinary skill in the art having the benefit of the instant disclosure that some of the process blocks can be executed in a variety of orders not illustrated.

Furthermore, the word "exemplary" and/or "demonstrative" is used herein to mean serving as an example, instance, or illustration. For the avoidance of doubt, the subject matter disclosed herein is not limited by such examples. In addition, any aspect or design described herein as "exemplary" and/or "demonstrative" is not necessarily to be construed as preferred or advantageous over other aspects or designs, nor is it meant to preclude equivalent exemplary structures and techniques known to those of ordinary skill in the art.

The disclosed subject matter can be implemented as a method, apparatus, or article of manufacture using standard programming and/or engineering techniques to produce software, firmware, hardware, or any combination thereof to control a computer to implement the disclosed subject matter. The term "article of manufacture" as used herein is intended to encompass a computer program accessible from any computer-readable device, computer-readable carrier, or computer-readable media. For example, computer-readable media can include, but are not limited to, magnetic storage devices, e.g., hard disk; floppy disk; magnetic strip(s); optical disk (e.g., compact disk (CD), digital video disc (DVD), Blu-ray Disc™ (BD)); smart card(s); and flash memory device(s) (e.g., card, stick, key drive); and/or a virtual device that emulates a storage device and/or any of the above computer-readable media.

Artificial intelligence based systems, e.g., utilizing explicitly and/or implicitly trained classifiers, can be employed in connection with performing inference and/or probabilistic determinations and/or statistical-based determinations as in accordance with one or more aspects of the disclosed subject matter as described herein. For example, an artificial intelligence system can be used, via object analysis component 310 (see below), to determine characteristic(s), e.g., dimensions(s), of an object in response to receiving, via external sensor(s), camera(s), etc. of a vehicle, data representing the characteristic(s). Furthermore, the artificial intelligence system can be used, via capacity management component 320 (see below), to determine a storage capacity of the vehicle, e.g., utilizing internal sensor(s), camera(s), etc. of the vehicle, and to determine whether the object is capable of storage within the vehicle based on the storage capacity and characteristic(s) of the object.

As used herein, the term "infer" or "inference" refers generally to the process of reasoning about, or inferring states of, the system, environment, user, and/or intent from a set of observations as captured via events and/or data. Captured data and events can include user data, device data, environment data, data from sensors, sensor data, application data, implicit data, explicit data, etc. Inference can be employed to identify a specific context or action, or can generate a probability distribution over states of interest based on a consideration of data and events, for example.

Inference can also refer to techniques employed for composing higher-level events from a set of events and/or data. Such inference results in the construction of new events or actions from a set of observed events and/or stored event data, whether the events are correlated in close temporal proximity, and whether the events and data come from one or several event and data sources. Various classification schemes and/or systems (e.g., support vector machines, neural networks, expert systems, Bayesian belief networks, fuzzy logic, and data fusion engines) can be employed in connection with performing automatic and/or inferred action in connection with the disclosed subject matter.

Aspects, features, and/or advantages of the disclosed subject matter can be exploited in substantially any wireless telecommunication or radio technology, e.g., Institute of Electrical and Electronics Engineers (IEEE) 802.11x (Wi-Fi™); Bluetooth™, Worldwide Interoperability for Microwave Access (WiMAX™); Enhanced General Packet Radio Service (Enhanced GPRS); Third Generation Partnership Project (3GPP) Long Term Evolution (LTE™); Third Generation Partnership Project 2 (3GPP2); Ultra Mobile Broadband (UMB); 3GPP Universal Mobile Telecommunication System (UMTS); High Speed Packet Access (HSPA); High Speed Downlink Packet Access (HSDPA); High Speed Uplink Packet Access (HSUPA); LTE™ Advanced (LTE-A), Global System for Mobile Communication (GSM), Near Field Communication (NFC), Wibree, Wi-Fi Direct™, etc.

Further, selections of a radio technology, or radio access technology, can include second generation (2G), third generation (3G), fourth generation (4G), etc. evolution of the radio access technology; however, such selections are not intended as a limitation of the disclosed subject matter and related aspects thereof. Further, aspects, features, and/or advantages of the disclosed subject matter can be exploited in disparate electromagnetic frequency bands. Moreover, one or more embodiments described herein can be executed in one or more network elements, such as a mobile wireless device, e.g., user equipment (UE), and/or within one or more elements of a network infrastructure, e.g., radio network controller, wireless access point (AP), etc.

Moreover, terms like "user equipment," (UE) "mobile station," "mobile subscriber station," "access terminal," "terminal", "handset," "appliance," "machine," "wireless communication device," "cellular phone," "personal digital assistant," "smartphone," "wireless device", and similar terminology refer to a wireless device, or wireless communication device, which is at least one of (1) utilized by a subscriber of a wireless service, or communication service, to receive and/or convey data associated with storage of objects within a vehicle, voice, video, sound, and/or substantially any data-stream or signaling-stream; or (2) utilized by a subscriber of a voice over internet protocol (VoIP) service that delivers voice communications over internet protocol (IP) networks such as the Internet or other packet-switched networks. Further, the foregoing terms are utilized interchangeably in the subject specification and related drawings.

A communication network, e.g., core network 106 (see below), for systems, methods, and/or apparatus disclosed herein can include any suitable mobile and/or wireline-based circuit-switched communication network including a global systems for mobile communication (GSM) network, a time division multiple access (TDMA) network, a code division multiple access (CDMA) network, such as IS-95 and subsequent iterations of CDMA technology, an integrated digital enhanced network (iDEN) network and a public switched telephone network (PSTN). Further, examples of the communication network can include any suitable data packet-switched or combination data packet/circuit-switched communication network, wired or wireless IP network such as a VoIP network, an IP data network, a universal mobile telecommunication system (UMTS) network, a general packet radio service (GPRS) network, or other communication networks that provide streaming data communication over IP and/or integrated voice and data communication over combination data packet/circuit-switched technologies.

Similarly, one of ordinary skill in the art will appreciate that a wireless system e.g., vehicle system 120 (see below), a wireless communication device, etc. for systems, methods, and/or apparatus disclosed herein can include a mobile device, a mobile phone, a 4G, etc. cellular communication device, a PSTN phone, a cellular communication device, a cellular phone, a satellite communication device, a satellite phone, a VoIP phone, an IEEE 802.11x (WiFi) phone, a dual-mode cellular/WiFi phone, a combination cellular/VoIP/WiFi/Worldwide Interoperability for Microwave Access (WiMAX) phone, a portable computer, or any suitable combination thereof. Specific examples of a wireless system can include, but are not limited to, a cellular device, such as a GSM, TDMA, CDMA, IS-95 and/or iDEN phone, a cellular/WiFi device, such as a dual-mode GSM, TDMA, IS-95 and/or iDEN/VoIP phones, UMTS phones, UMTS VoIP phones, or like devices or combinations thereof.

To provide support for the wireless system, the communication network can include a gateway routing component (not shown) that can include any suitable component that can perform centralized routing within a mobile, satellite, or similar network (but optionally need not include components that route strictly within a PSTN network), routing between communication networks, between networks of varying architecture (e.g., between PSTN, GSM, UMTS), Enterprise VoIP, the Internet, or combinations thereof), and the like. Specific examples of a gateway routing component can include, but are not limited to, a gateway mobile switching center (GMSC), a gateway general packet radio service (GPRS) support node (GGSN), a session border control (SBC) device, or like devices. Additionally, a data storage component of such system(s), device(s), etc. can include any suitable device, process, and/or combination device that can store digital and/or switched information (e.g., server, data store component, or the like).

Figure 2:
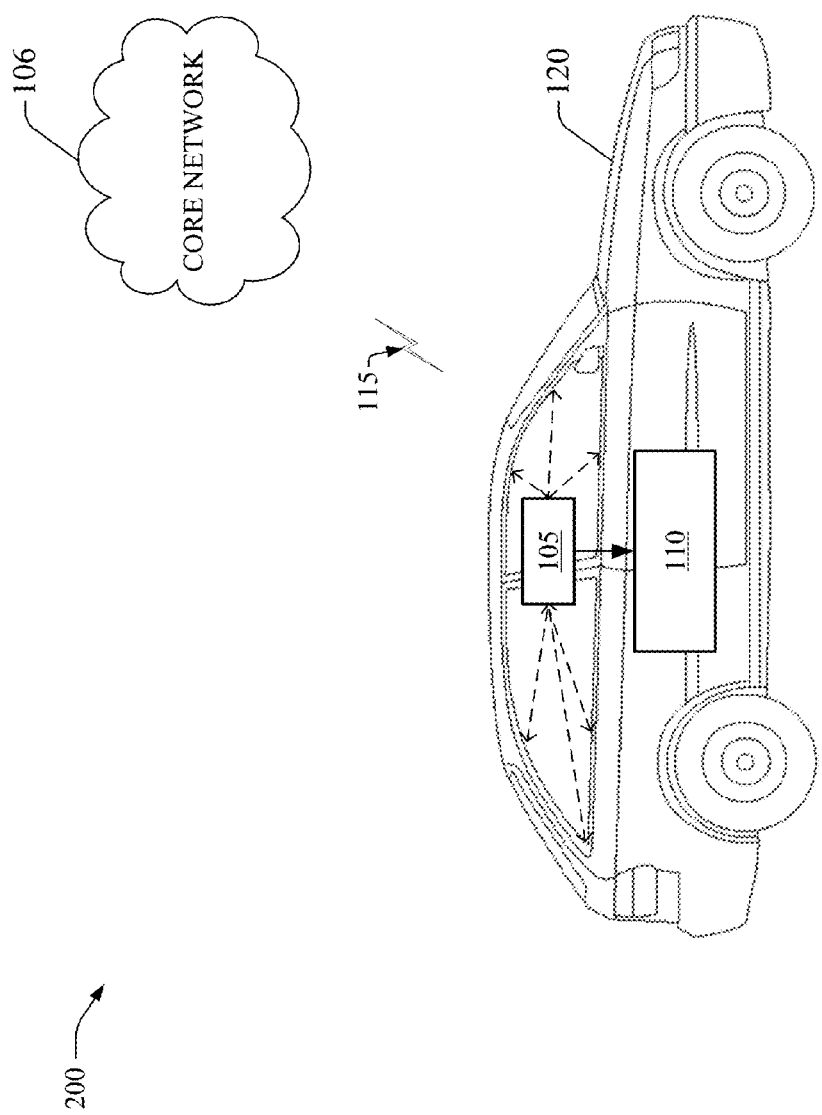
FIG. 2 illustrates a block diagram of another vehicle environment, in accordance with various embodiments.

Now referring to FIGS. 1 and 2, vehicle environments 100 and 200 for tracking and determining remaining storage capacity of a vehicle are illustrated, respectively, in accordance with embodiments. In an aspect, vehicle system 120 can be wirelessly coupled to core network 106 via wireless link 115. Wireless link 115 can be an over-the-air wireless link 115 comprising a downlink (DL) and an uplink (UL) (both not shown) that can utilize a predetermined band of radio frequency (RF) spectrum associated with, e.g., GSM, 3GPP UMTS, etc. Accordingly, wireless system 110 can be a GSM and/or 3GPP UMTS based device, etc.

Core network 106 can include software and/or hardware configured to provide connectivity to/from vehicle system 120. Vehicle environment 100 can include one or more: macro, Femto, or pico access points (APs) (not shown); base stations (BS) (not shown); landline networks (e.g., optical landline networks, electrical landline networks) (not shown) communicatively coupled between vehicle system 120 and core network 106. In various embodiments, vehicle system 120 can communicate via any number of various types of wireless technologies including, but not limited to, cellular, WiFi, WiMax, wireless local area networks (WLAN), Femto, etc. In corresponding embodiments, core network 106 can provide cellular, WiFi, WiMAX, WLAN, and/or other technologies for facilitating such communication. Further, core network 106 can include one or more of the Internet (or another communication network (e.g., IP-based network)), or a digital subscriber line (DSL)-type or broadband network facilitated by Ethernet or other technology.

While only vehicle system 120 is illustrated in various embodiments, core network 106 can include, or can be communicatively coupled to, other communication devices, wirelessly connected vehicles, systems, etc. inside or outside of vehicle environment 100. Further, in various embodiments, vehicle environment 100 can include hardware and/or software for allocating resources to vehicle system 120, e.g., converting or enforcing protocols, establishing and/or providing levels of Quality of Service (QoS), providing applications or services via core network 106, translating signals, and/or performing other desired functions to facilitate system interoperability and communication to or from vehicle system 120.

Core network 106 can also include data store component(s), a memory configured to store information, and/or computer-readable storage media storing computer-executable instructions enabling various operations performed via wireless system 110 and described herein. In this regard, core network 106 can include data store component(s), e.g., cloud-based data store 420 (see below) for correlating objects with defined characteristics, e.g., dimensions, packing classifications, weight, etc. of the objects. For example, cloud-based data store can include a data table cross-referencing identifiers of objects with defined characteristics of the objects, e.g., associating barcodes representing objects with defined characteristics of the objects. In this regard, for example, when component(s) of vehicle system 120 detect that a scan of information representing the object, e.g., a barcode, an RFID tag, an NFC tag, a label, etc. has occurred, such component(s) can send a query, including the information representing the object to cloud-based data store 420 (see below), and receive, from cloud-based data store 420 based on the query, characteristic(s), e.g., dimension(s), etc. associated with the object.

It should be appreciated that one or aspects, components, etc. of wireless systems described herein, e.g., vehicle system 120, can be included in core network 106. For example, core network 106 can include a cloud-based computing component 1520 that is communicatively coupled to cloud-based data store 420. In this regard, vehicle system 120 can send image data associated with an object to the cloud-based computing component 1520. Further, vehicle system 120 can receive the characteristic(s), e.g., dimensions(s), etc. associated with the object in response to the cloud-based computing component 1520 computing the characteristic(s) based on the image data.

Referring now to FIG. 1, vehicle system 120 can include sensor component 105 communicatively coupled to wireless system 110. Sensor component 105 can include one or more imaging devices, e.g., camera(s), communicatively coupled to wireless system 110 for monitoring, scanning, etc. an external environment of vehicle system 120 where object 107, e.g., potential cargo of vehicle system 120, is located. Further, wireless system 110 can determine characteristic(s), e.g., dimension(s), etc. of object 107 in response to such monitoring, scanning, etc. of the external environment.

In another embodiment illustrated by FIG. 2, sensor component 105 can include imaging device(s), e.g., camera(s), etc. communicatively coupled to wireless system 110 for monitoring, scanning, etc. of an internal environment, a storage space, etc. of vehicle system 120. Further, wireless system 110 can determine remaining storage space of vehicle system 120 in response to such monitoring, scanning etc. Further, based on the determined characteristic(s) of object 107, and the determined remaining storage space of vehicle system 120, wireless system 110 can determine whether object 107 is capable of placement, storage, etc. within the remaining storage space of vehicle system 120.

Figure 3:
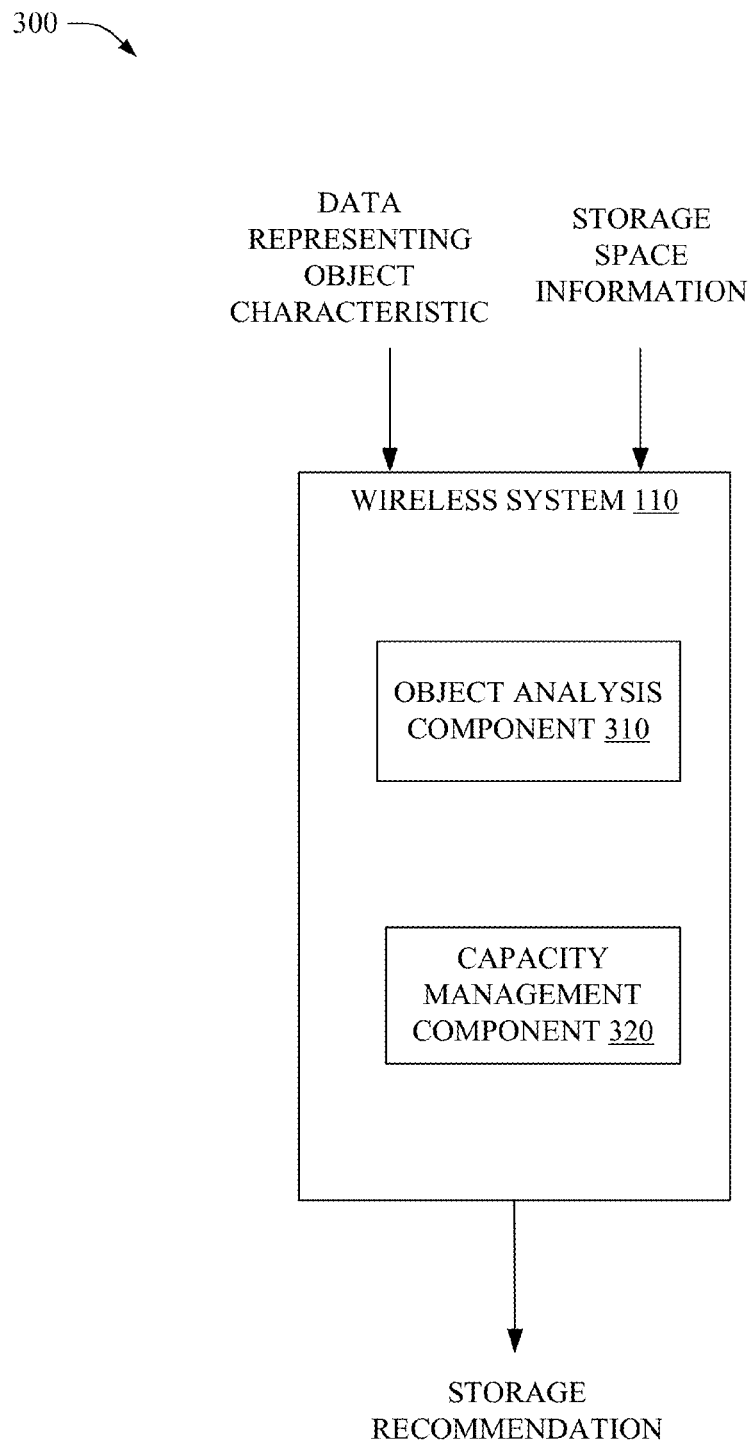
FIG. 3 illustrates a block diagram of a wireless system environment, in accordance with various embodiments.

FIG. 3 illustrates a block diagram 300 of wireless system 110, in accordance with various embodiments. As illustrated by FIG. 3, wireless system 110 can include object analysis component 310 and capacity management component 320. Object analysis component 310 can be configured to determine, receive, etc. a characteristic, e.g., a size, a dimension, a center of gravity, a weight, a fragility, a packing classification, etc. of an object, e.g., object 107.

In one embodiment, object analysis component 310 can be configured to receive, via sensor component 105, data representing the characteristic of the object. In an aspect, sensor component 105 can include an imaging device, a camera, a 3-dimensional scanner, a laser based imaging device, etc. for scanning, examining, etc. the characteristic of the object, e.g., in response to object analysis component 310 detecting the object approaching a vehicle, in response to detecting that the object has been placed outside of the vehicle, etc.

In another aspect, object analysis component 310 can be configured to detect, e.g., via sensor component 105, that an object of a set of objects, e.g., including a passenger of the vehicle, a component of the vehicle, etc. has been removed from the storage space of the vehicle, e.g., the data representing the characteristic of the object representing an increase in the remaining storage space of the vehicle.

In other embodiment(s), object analysis component 310 can be configured to receive the data representing the characteristic from cloud-based computing component 1520 of core network 106. For example, as described above, vehicle system 120 can send image data associated with an object to cloud-based component 1520. Further, vehicle system 120 can receive the characteristic of the object from cloud-based computing component 1520 in response to cloud-based computing component 1520 determining the characteristics based on the image data.

Figure 4:
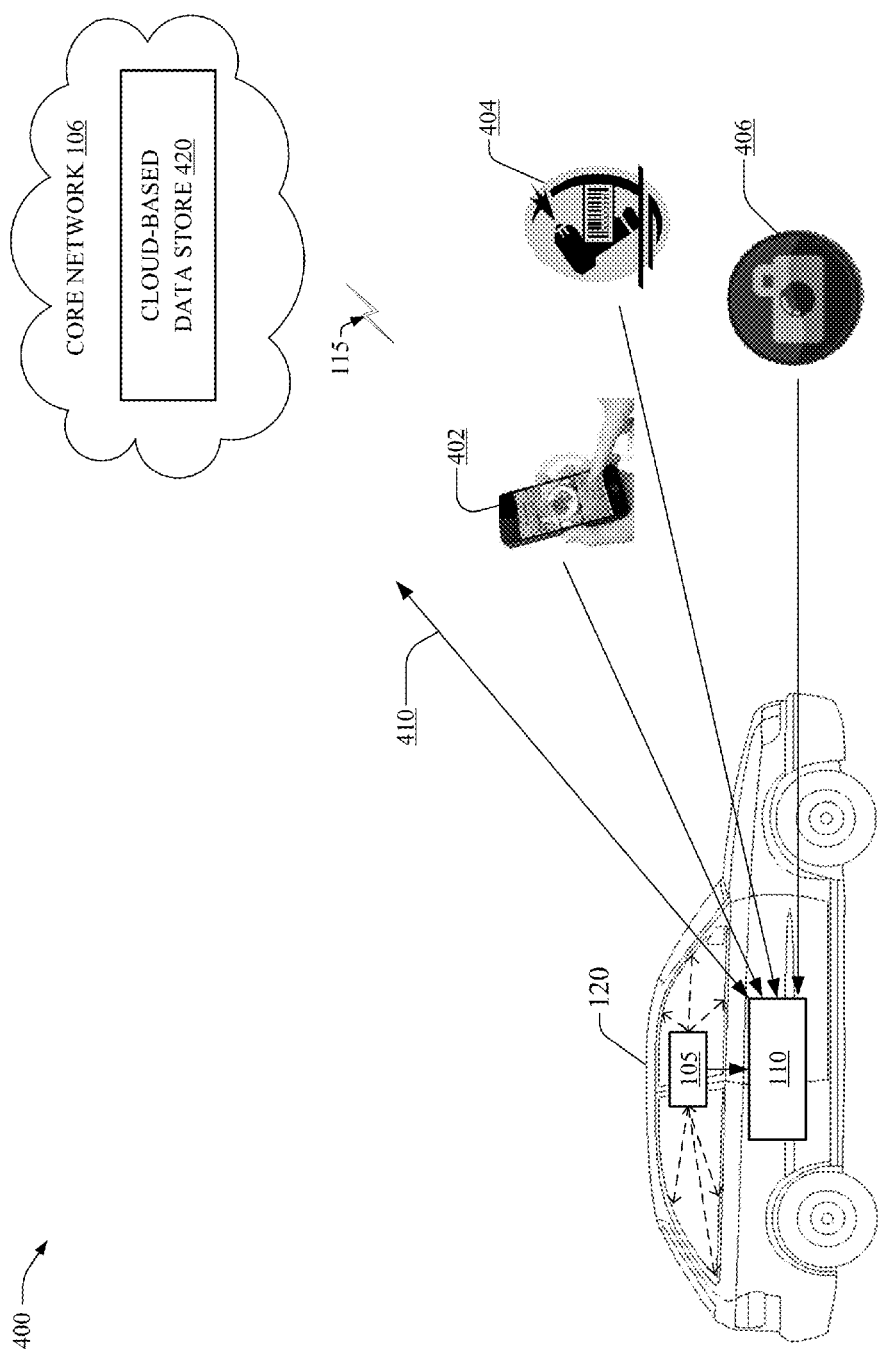
FIG. 4 illustrates a block diagram of yet another vehicle environment, in accordance with various embodiments.

In yet other embodiment(s), and now referring to FIG. 4, object analysis component 310 can be configured to receive the data representing the characteristic via cloud-based data store 420, e.g., in response to sending query 410 including a request for the characteristic to cloud-based data store 420. As described above, cloud-based data store 420 can be configured to correlate an object with a defined characteristic, e.g., a dimension, a center of gravity, a weight, a fragility, a packing classification, a material, a strength of the material, a composition of the material, etc. of the object. In one aspect, the defined characteristic can represent how prone an object is to staining, a predetermined probability that the object will roll and/or tilt, etc. In another aspect, cloud-based data store 420 can include a data table cross-referencing, associating, correlating, etc. identifiers of the objects, e.g., barcodes representing the objects, with defined characteristics of the objects.

In one aspect, object analysis component 310 can be configured to receive the data representing the characteristic in response to detection of a purchase 402 via an electronic payment, a mobile payment, a mobile wallet transaction, an Isis Mobile Wallet™ transaction, etc. associated with a purchase of the object.

In another aspect, object analysis component 310 can be configured to receive the data representing the characteristic in response to detection of a scan 404 of a barcode, an RFID tag, an NFC tag, a label, etc. associated with the object.

In yet another aspect, object analysis component 310 can be configured to receive the data representing the characteristic in response to receiving picture 406 associated with the object, e.g., from a mobile device, a smartphone, a wearable device, e.g., a camera attached to eyewear, etc. For example, a wearable camera device, e.g., glasses, etc. can remotely initiate wireless system 110 to determine whether the object can be placed, stored, etc. within the remaining storage space of vehicle system 120 by sending picture 406 to object analysis component 310, for example, in response to taking, capturing, etc. picture 406 of the object.

In this regard, upon detecting purchase 402, detecting scan 404, and/or receiving picture 406, object analysis component 310 can send query 410 including information representing the object to cloud-based data store 420. Further, based on query 410, object analysis component 310 can receive, from cloud-based data store 420, characteristic(s), e.g., dimension(s), etc. associated with the object.

Referring now to FIG. 3, capacity management component 320 can be configured to determine, based on storage space information of a vehicle of vehicle system 120 and the data representing the characteristic of the object, whether the object is capable of storage within the vehicle. In an aspect, capacity management component 320 can determine an observed size of a storage space of the vehicle, e.g., utilizing internal sensor(s), camera(s), etc. of the vehicle. For example, capacity management component 320 can use interior cameras of the vehicle to determine locations and positions of all objects and occupants in the vehicle.

In one aspect, in response to receiving, e.g., via cloud-based data store 420, storage space information representing, e.g., a maximum size of the storage space the vehicle, specifications of the vehicle, manufacturing data of the vehicle, etc. including dimension(s) of an interior of the vehicle, seat configuration(s) of the vehicle, etc., capacity management component 320 can determine, based on the observed size of the storage space and the storage space information, a remaining storage space, capacity, etc. of the vehicle. In this regard, capacity management component 320 can provide, based on the determined remaining storage space, a storage recommendation representing whether the object is capable of storage within the vehicle.

In another aspect, capacity management component 320 can receive, from object analysis component 310, information representing an increase in the remaining storage space, capacity, etc. of the vehicle in response to object analysis component 310 determining that an object of a set of objects has been removed from the storage space of the vehicle.

Figure 5:
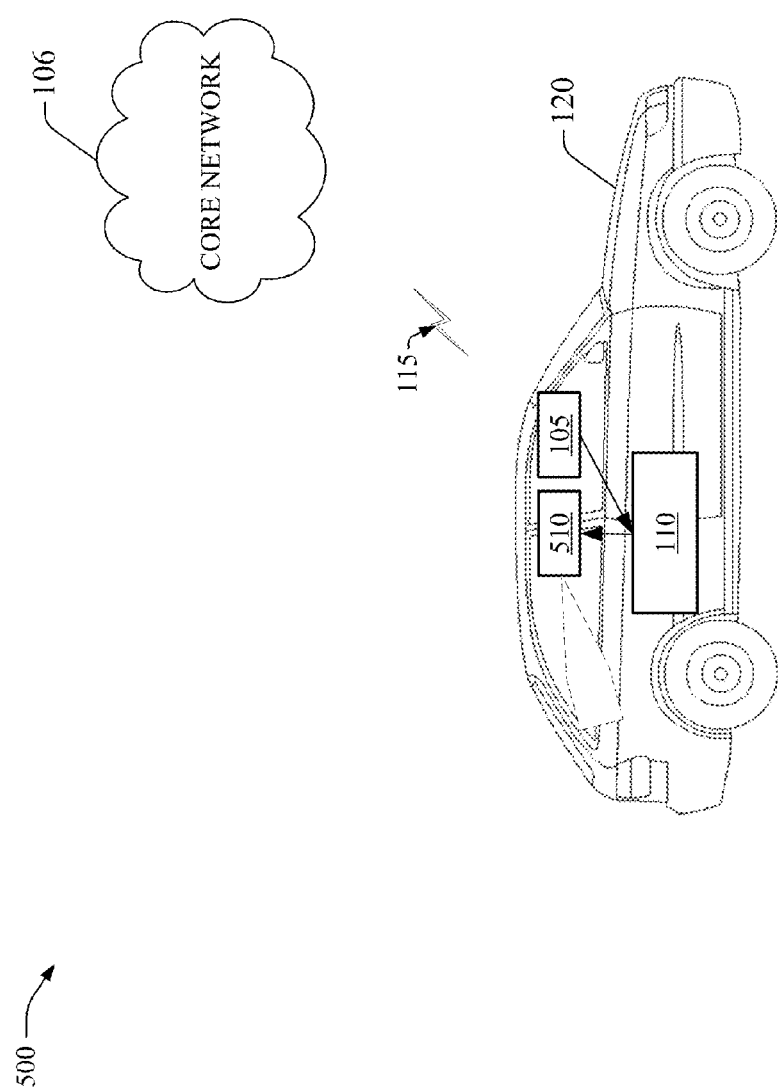
FIG. 5 illustrates a block diagram of a vehicle environment including a notification component, in accordance with various embodiments.

In yet another aspect, capacity management component 320 can determine whether removal of the object of the set of objects has caused instability, increased risk, probability, etc. of damage, etc. to remaining objects, occupants, etc. of the vehicle. In this regard, and referring now to embodiment(s) illustrated by FIG. 5, vehicle system 120 can include notification component 510, which can notify, warn, etc. a user, via a smartphone, via a sound device, a display device, a monitor, etc. of the vehicle, of the instability, the increased risk of damage, etc.

In one embodiment, notification component 510 can notify, warn, etc. the user, via the smartphone, via the sound device, the display device, the monitor, etc. of the vehicle, that the object will not fit, cannot be stored, etc. in the vehicle, for example, in response to capacity management component 320 determining that the object is not capable of storage within the vehicle, e.g., in response to object analysis component 310 detecting purchase 402, detecting scan 404, and/or receiving picture 406.

In other embodiment(s), notification component 510 can notify, warn, etc. the user by sending a text message, a voice-based message, etc. to the mobile device, the smartphone, the wearable device, e.g., a display device attached to eyewear, etc. including a warning that the object cannot be stored in the vehicle, for example, in response to capacity management component 320 determining that the object is not capable of storage within the vehicle, e.g., in response to object analysis component detecting purchase 402, detecting scan 404, and/or receiving picture 406.

In an embodiment, in response to capacity management component 320 determining that the object is capable of storage within the vehicle, capacity management component 320 can be configured to determine a candidate location for the object within the storage space of the vehicle. Further, notification component 510 can be configured to display information, e.g., via a laser projection device, via a display device of the vehicle, etc. representing the candidate location. For example, notification component 510 can be configured to project a colored shape, a hologram, etc. on the candidate location. In one embodiment, notification component 510 can notify the user, via the smartphone, via the sound device, the display device, the monitor, etc. of the vehicle of the candidate location.

In another embodiment, capacity management component 320 can be configured to determine a candidate orientation for the object within the storage space of the vehicle, e.g., based on the storage space information of the vehicle and the data representing the characteristic of the object. Further, in response to capacity management component 320 determining that the object is capable of storage within the vehicle, notification component 510 can be configured to display information, e.g., via the laser projection device, via the display device of the vehicle, etc. representing the candidate orientation. For example, notification component 510 can be configured to project a colored shape, a hologram, etc. representing the candidate orientation. In one embodiment, notification component 510 can notify the user, via the smartphone, via the sound device, the display device, the monitor, etc. of the vehicle of the candidate orientation.

In an embodiment, in response to capacity management component 320 determining that the object is capable of storage within the vehicle, capacity management component 320 can be configured to determine an order of placements for a set of objects including the object within the storage space of the vehicle. Further, notification component 510 can be configured to notify the user, via the smartphone, via the sound device, the display device, the monitor, etc. of the vehicle of the order of placements for the set of objects.

In one embodiment, capacity management component 320 can determine options for stacking objects based on storage information of the vehicle and data representing characteristics of the objects. For example, capacity management component 320 can determine that fragile objects should be secured on top of non-fragile objects, and notification component 510 can notify the user, via the smartphone, via the sound device, the display device, the monitor, etc. of the vehicle of the options for stacking the objects.

In another embodiment, capacity management component 320 can receive information, e.g., a shopping list, etc. representing planned purchases of objects. Further, in response to determining that an object of the objects will not fit in a remaining storage space of the vehicle, capacity management component 320 can determine, based on received traffic information associated with a predetermined location, a proposed time to unload the objects from the vehicle at the predetermined location. Further, notification component 510 can notify a user, via the smartphone, the sound device, the display device, the monitor, etc. of the vehicle of the proposed time.

Figure 6:
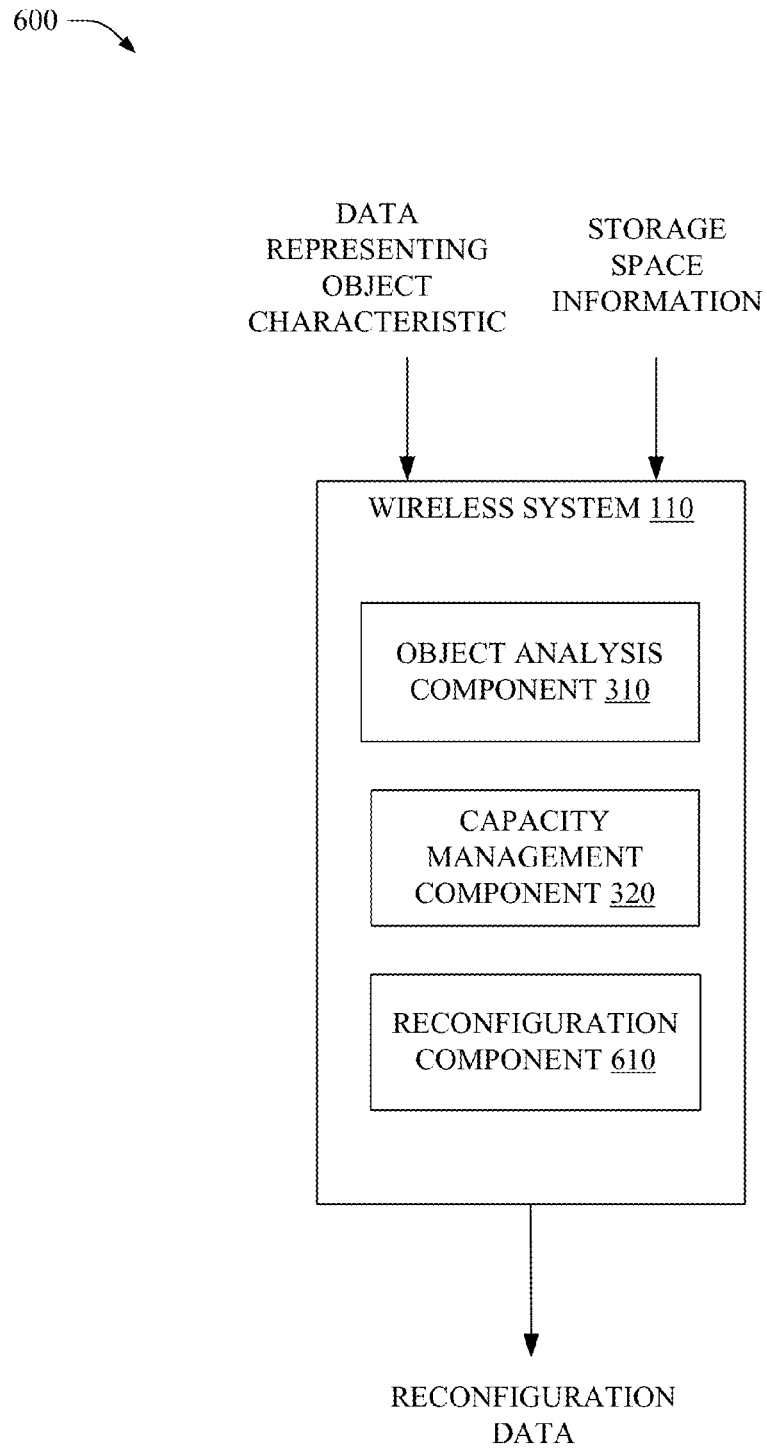
FIG. 6 illustrates a block diagram of another wireless system environment, in accordance with various embodiments.
Figure 7:
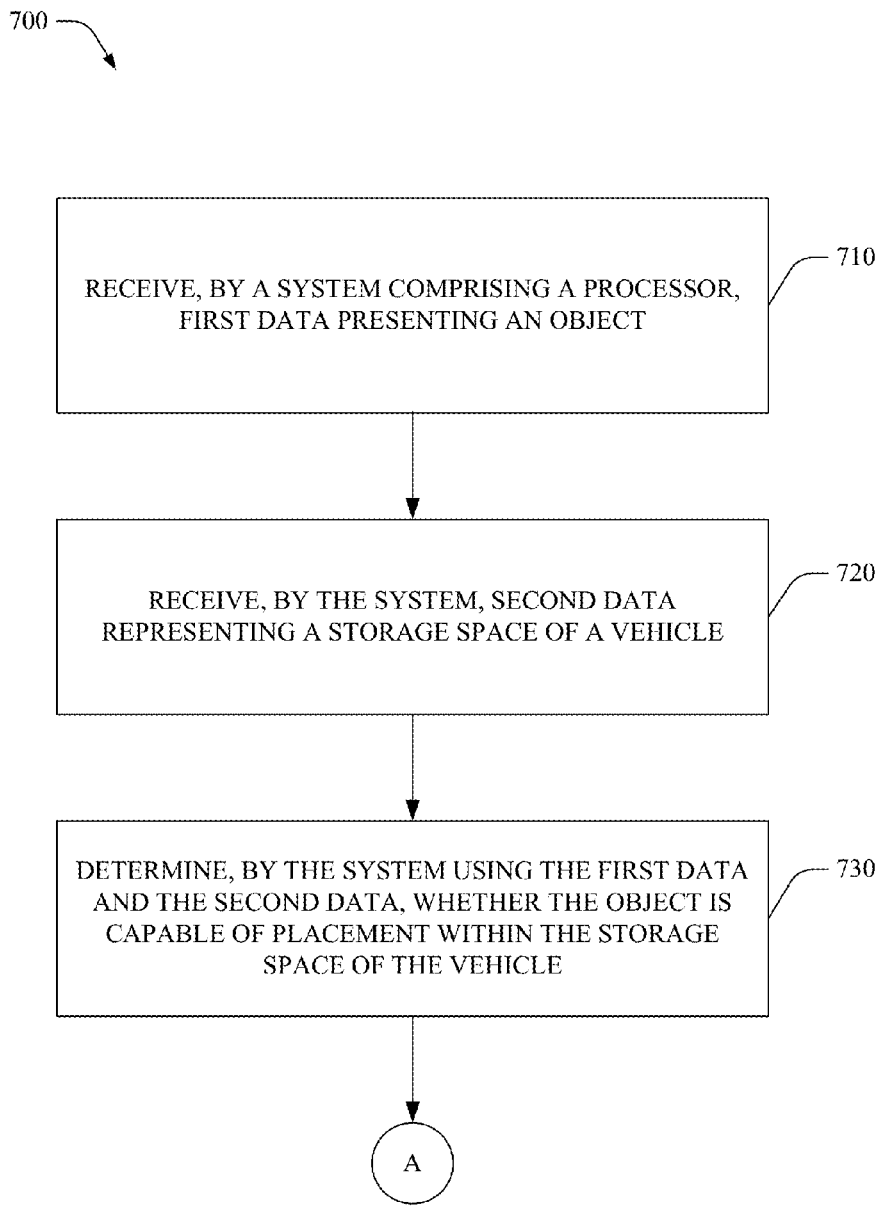
FIGS. 7-14 illustrate flowcharts of methods associated with vehicle environments, in accordance with various embodiments.
Figure 8:
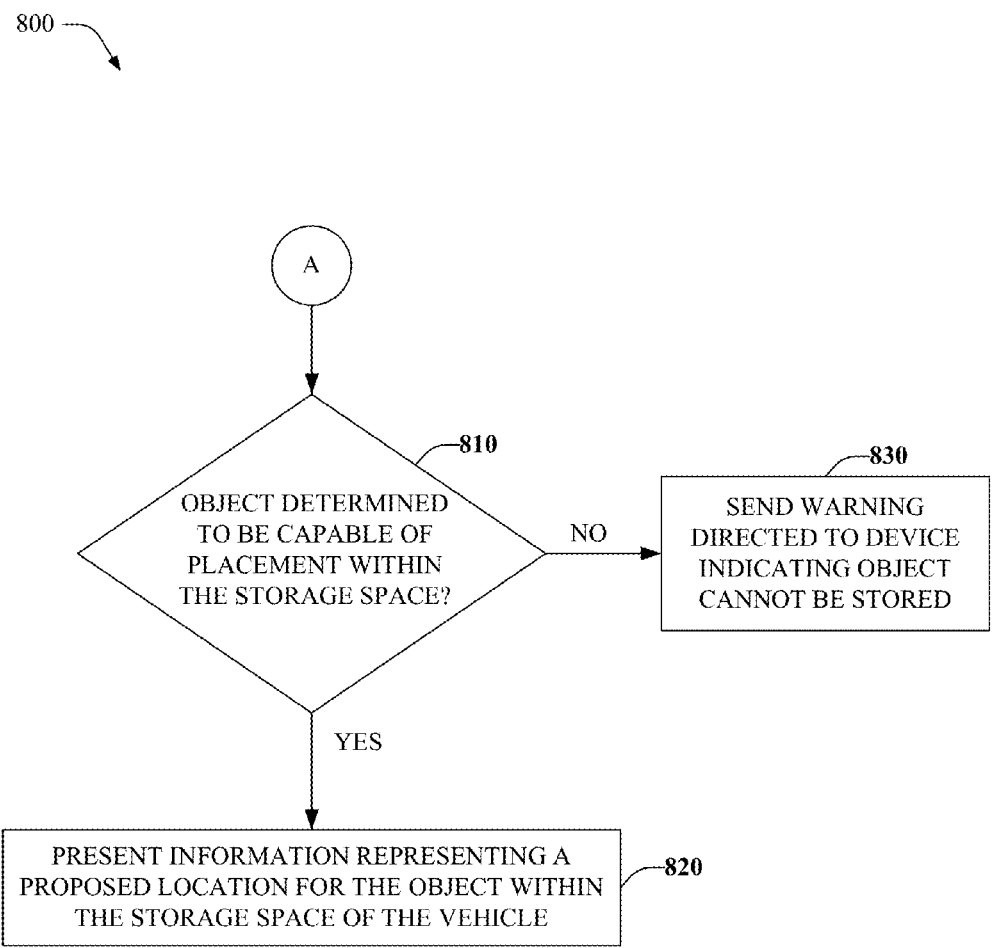
Figure 9:
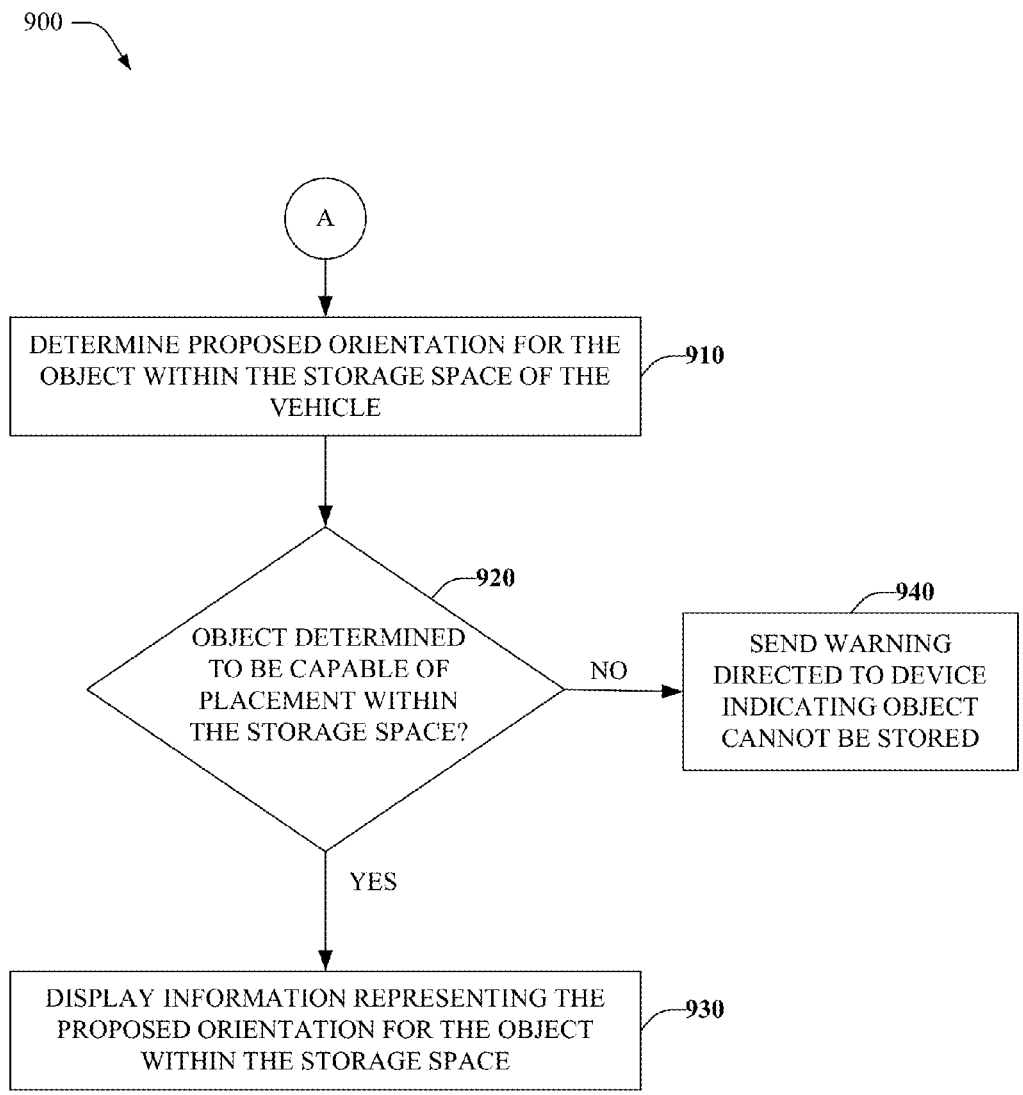
Figure 10:
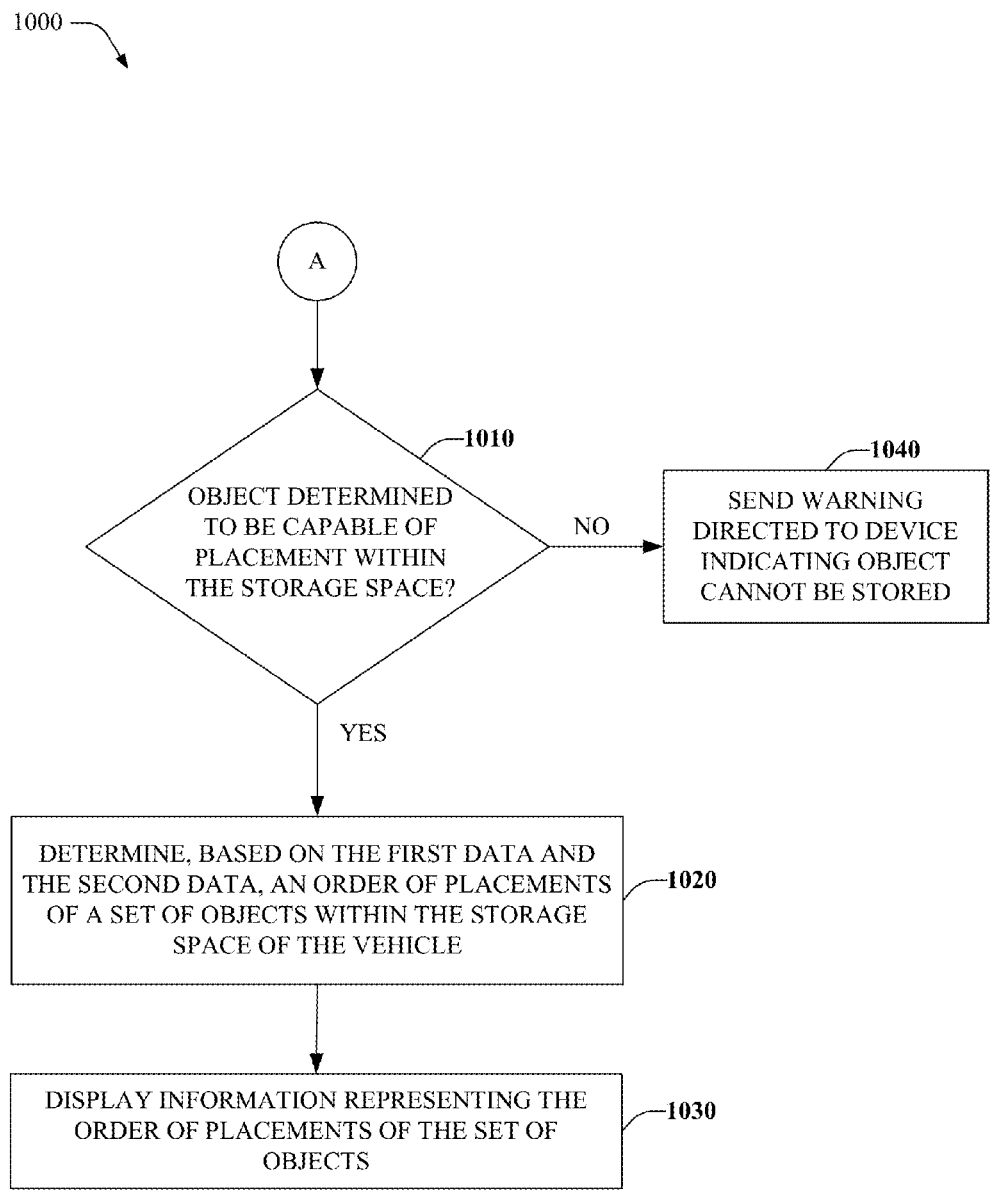
Figure 11:
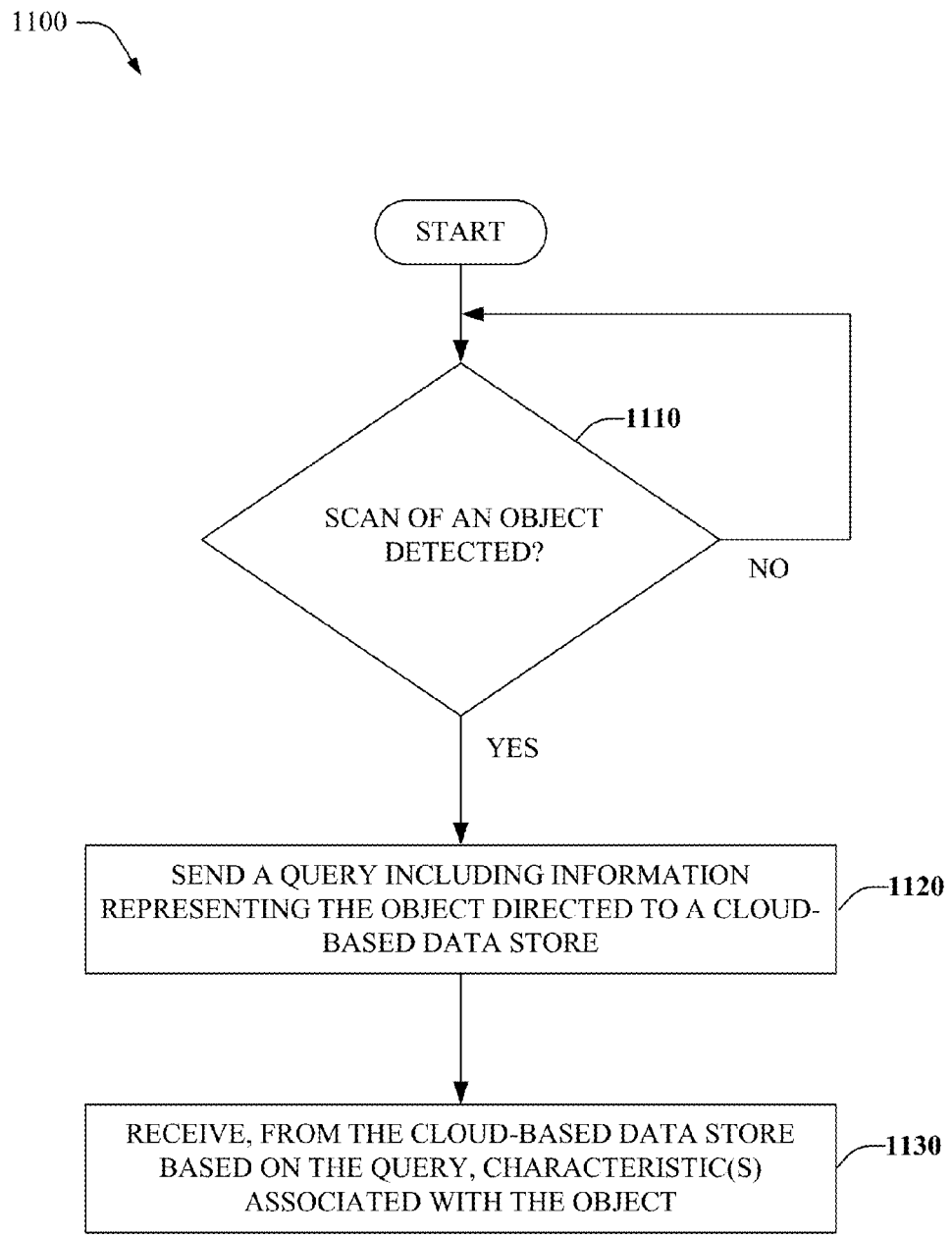
Figure 12:
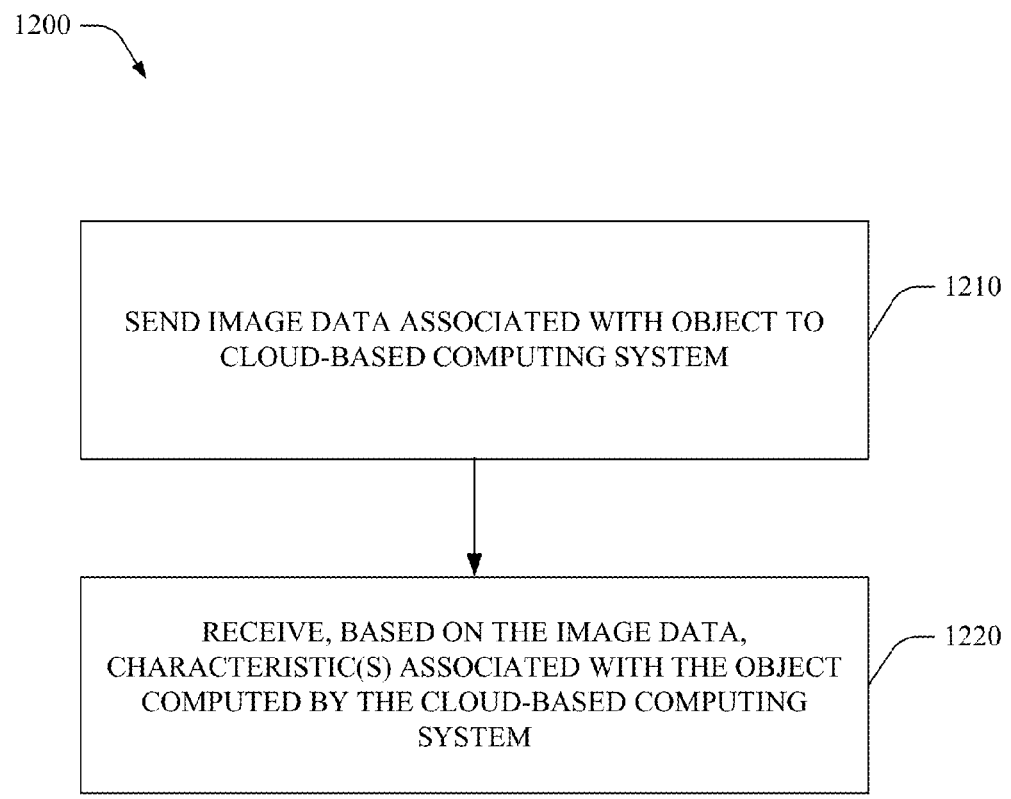
Figure 13:
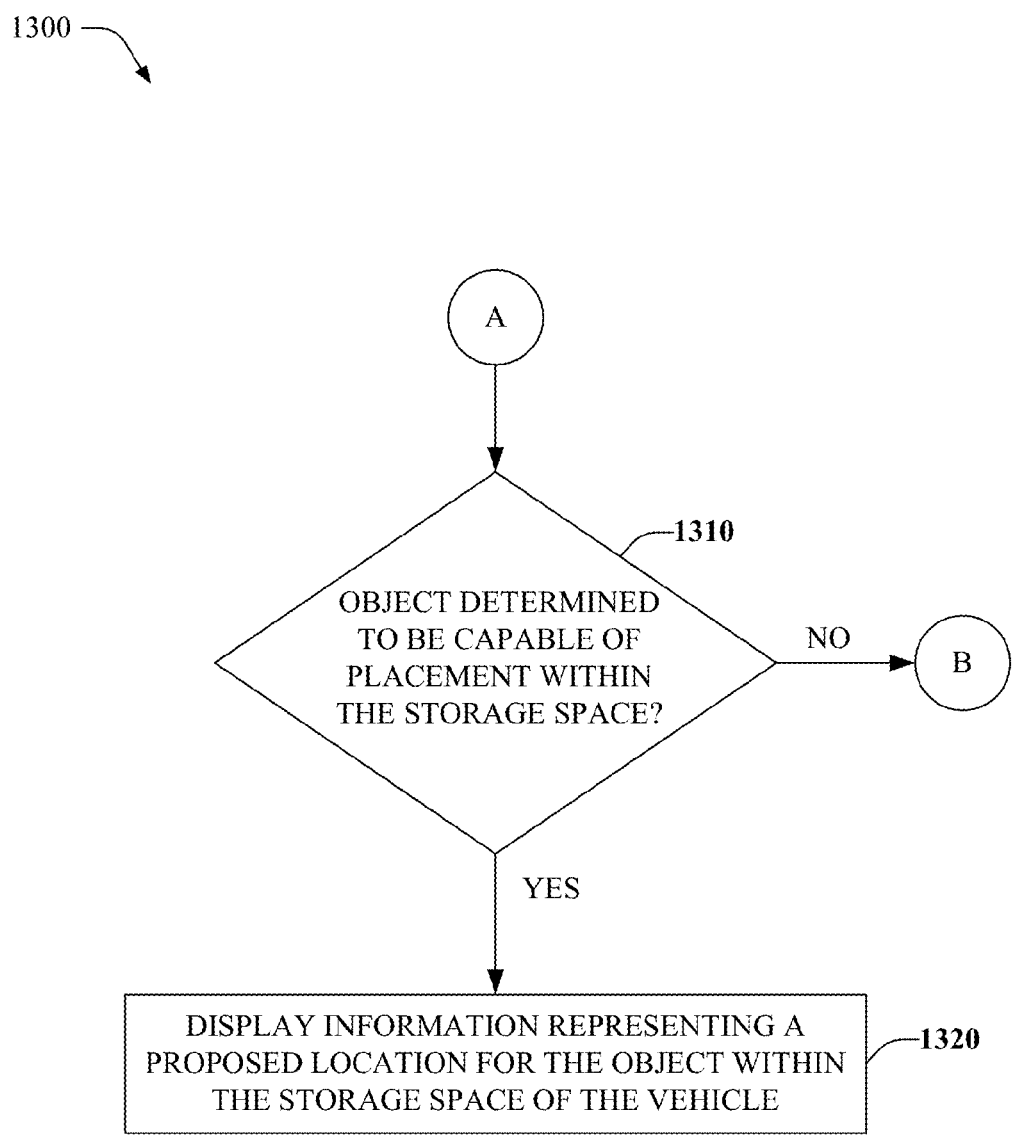
Figure 14:
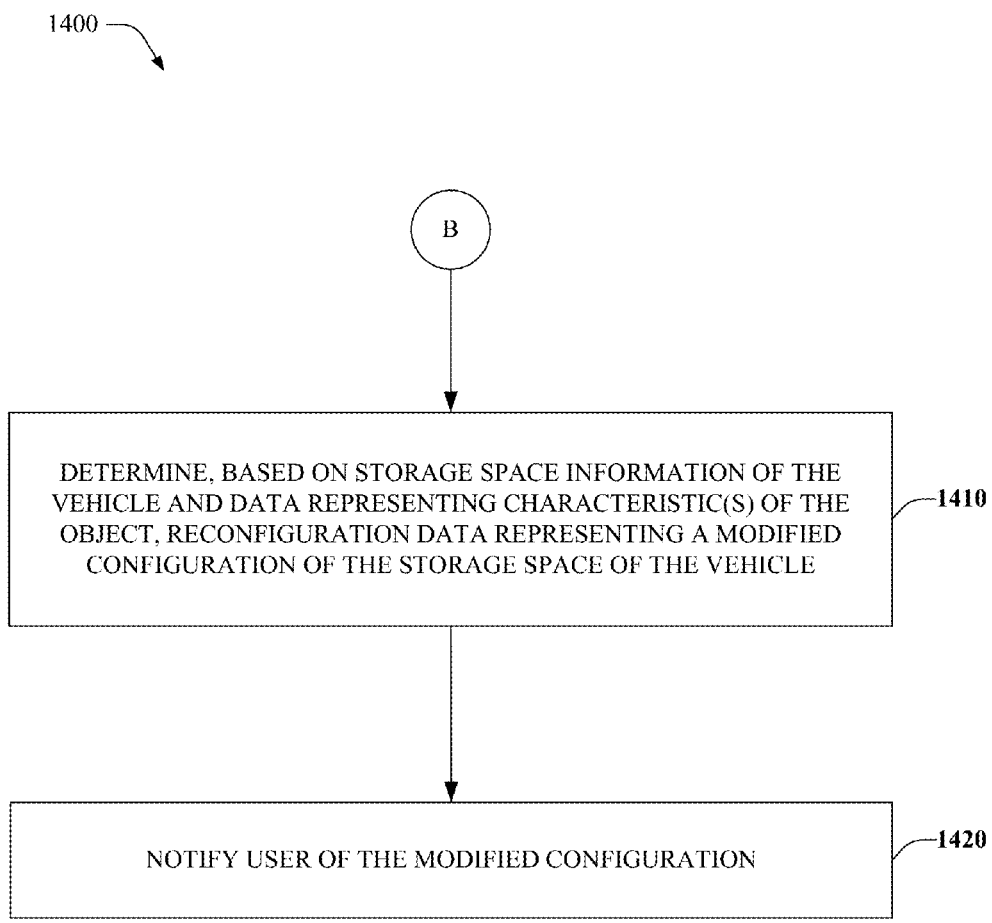

Now referring to FIG. 6, a block diagram of a wireless system environment including a reconfiguration component 610 is illustrated, in accordance with various embodiments. In this regard, in response to capacity management component 320 determining that the object will not fit in the remaining storage space of the vehicle, reconfiguration component 610 can determine, based on storage space information of the vehicle and the data representing the characteristic of the object, reconfiguration data representing a modified configuration of the storage space of the vehicle.

For example, in response to the storage space of vehicle system 120 being determined to include adaptable components, e.g., a floor, a wall, a partition, etc. of the vehicle that can change position, shape, etc. to support objects, prevent the objects from rolling and/or tilting, separate the objects, create levels for stacking fragile objects, etc. reconfiguration component 610 can determine a configuration of the adaptable components that would be compatible with storage of the object. Further, notification component 510 can notify the user, via the smartphone, the sound device, the display device, the monitor, etc. of the vehicle of the determined configuration.

FIGS. 7-14 and 16 illustrate methodologies in accordance with the disclosed subject matter. For simplicity of explanation, the methodologies are depicted and described as a series of acts. It is to be understood and appreciated that the subject innovation is not limited by the acts illustrated and/or by the order of acts. For example, acts can occur in various orders and/or concurrently, and with other acts not presented or described herein. Furthermore, not all illustrated acts may be required to implement the methodologies in accordance with the disclosed subject matter. In addition, those skilled in the art will understand and appreciate that the methodologies could alternatively be represented as a series of interrelated states via a state diagram or events. Additionally, it should be further appreciated that the methodologies disclosed hereinafter and throughout this specification are capable of being stored on an article of manufacture to facilitate transporting and transferring such methodologies to computers. The term article of manufacture, as used herein, is intended to encompass a computer program accessible from any computer-readable device, carrier, or media.

Referring now to FIGS. 7-14, processes 700 to 1400 associated with vehicle system 120 are illustrated, in accordance with various embodiments. At 710, first data representing an object can be received by wireless system 110. In an aspect, the first data can represent dimensions of the object, a fragility of the object, etc. In another aspect, the first data can be received via sensor component 105 of vehicle system 120. At 720, second data representing a storage space of a vehicle can be received by wireless system 110. In an aspect, the second data can represent remaining storage space of the vehicle. In another aspect, the second data can be received via sensor component 105. At 730, wireless system 110 can determine, using the first data and the second data, whether the object is capable of placement within the storage space of the vehicle.

At 810, in response to the object being determined to be capable of placement within the storage space of the vehicle, flow continues to 820, at which information representing a proposed location for the object within the storage space of the vehicle can be presented via, e.g., a projection device, an audio device, a video device, etc.; otherwise, flow continues to 830, at which a warning can be sent to a device, e.g., a smartphone, a device of the vehicle, etc. indicating the object cannot be stored.

At 910, a proposed orientation for the object within the storage space of the vehicle can be determined. At 920, it can be decided whether the object has been determined to be capable of placement within the storage space of the vehicle. In response to the object being determined to be capable of placement within the storage space of the vehicle, flow continues to 930, at which information representing the proposed orientation for the object within the storage space of the vehicle can be presented via, e.g., a projection device, an audio device, a video device, etc.; otherwise, flow continues to 940, at which a warning can be sent to a device, e.g., a smartphone, a device of the vehicle, etc. indicating the object cannot be stored.

At 1010, it can be decided whether the object has been determined to be capable of placement within the storage space of the vehicle. In response to the object being determined to be capable of placement within the storage space of the vehicle, flow continues to 1020, at which an order of placements of a set of objects, including the object, within the storage space of the vehicle can be determined based on the first data and the second data; otherwise, flow continues to 1040, at which a warning can be sent to a device, e.g., a smartphone, a device of the vehicle, etc. indicating the object cannot be stored. At 1030, information representing the order of placements of the set of objects can be displayed via, e.g., a smartphone, a device of the vehicle, etc.

At 1110, it can be determined whether a scan of information representing the object, e.g., a barcode, an RFID tag, an NFC tag, a label, etc. associated with the object has been detected, e.g., before the object has been purchased, during purchase of the object, etc. In response detection of the scan, flow continues to 1120, at which a query, including information representing the object, can be sent that is directed to a cloud-based data store, e.g., 420; otherwise, flow continues to 1110. At 1130, characteristic(s), e.g., dimension(s), etc. associated with the object can be received from the cloud-based data store based on the query.

At 1210, image data associated with an object, e.g., a picture of the object captured via a smartphone, etc. can be sent to a cloud-based computing system, e.g., 1520 (see below). At 1220, characteristic(s), e.g., dimension(s), etc. associated with the object, e.g., computed, determined, etc. by the cloud-based computing system based on the image data, can be received.

At 1310, it can be decided whether the object has been determined to be capable of placement within the storage space of the vehicle. In response to the object being determined to be capable of placement within the storage space of the vehicle, flow continues to 1320, at which information representing a proposed location for the object within the storage space of the vehicle can be displayed, projected, etc. via, e.g., a smartphone, a device of the vehicle, etc.; otherwise, flow continues to 1410, at which reconfiguration data representing a modified configuration of the storage space of the vehicle can be determined based on storage space information of the vehicle and data representing characteristic(s), e.g., dimension(s), etc. of the object. At 1420, a user can be notified of the modified configuration via, e.g., a smartphone, a device of the vehicle, etc.

Figure 15:
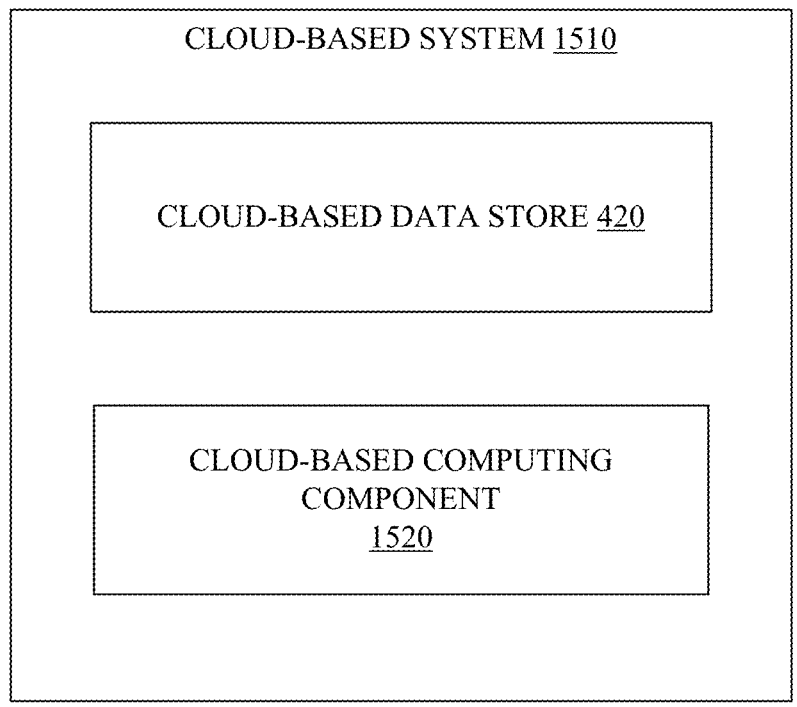
FIG. 15 illustrates a block diagram of a cloud-based system, in accordance with various embodiments.
Figure 16:
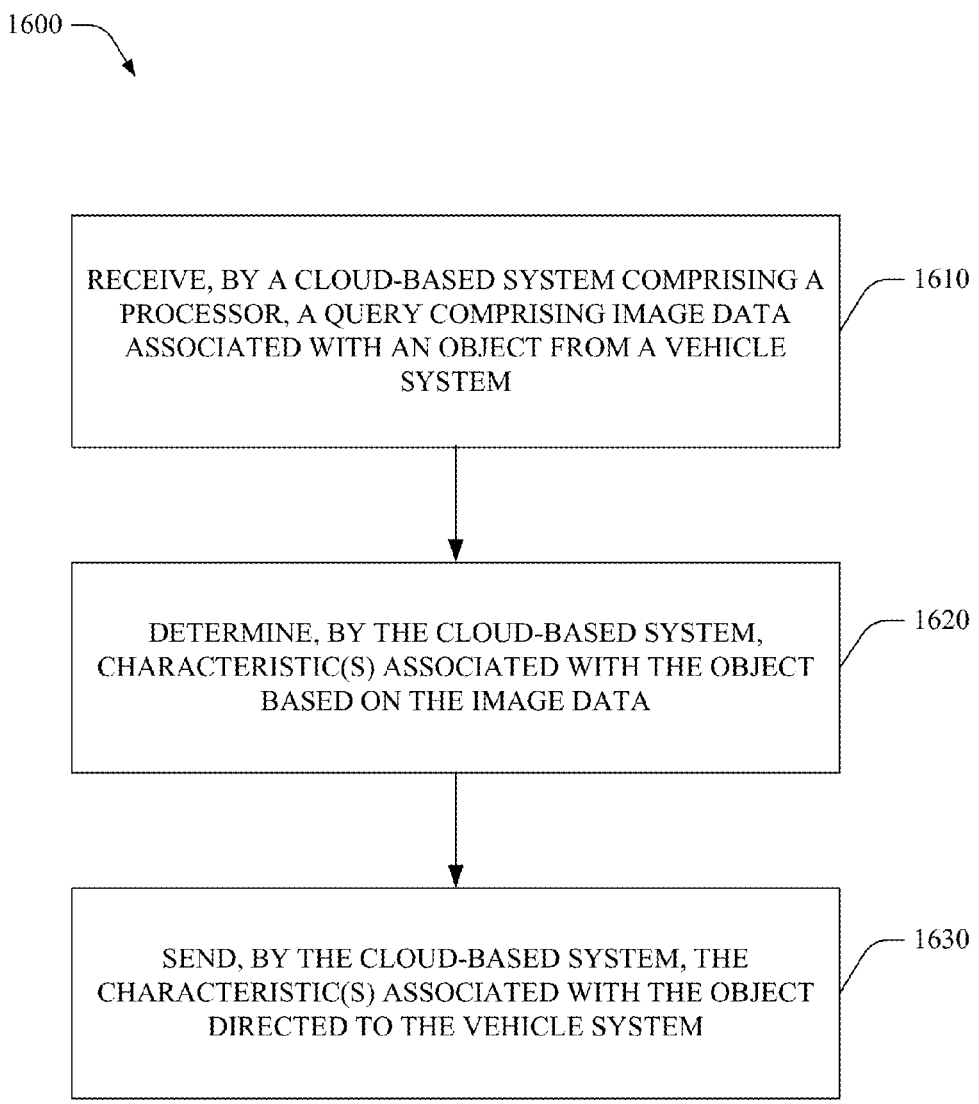
FIG. 16 illustrates a flowchart of a method associated with the cloud-based system, in accordance with various embodiments.

FIGS. 15 and 16 illustrate a block diagram of cloud-based system 1510 and an associated process 1600, respectively, in accordance with various embodiments. Cloud-based system 1510 can include a cloud-based data store, e.g., 420, which can be configured to correlate objects with defined characteristics, e.g., dimensions, packing classifications, weight, etc. of the objects. For example, the cloud-based data store can include a data table cross-referencing identifiers of the objects with the defined characteristics of the objects, e.g., associating barcodes representing the objects with the defined characteristics.

Further, cloud-based system 1510 can include cloud-based computing component 1520. In this regard, and now referring to FIG. 16, at 1610, cloud-based computing component 1520 can receive a query including image data associated with an object from vehicle system 120, e.g., in response to a detection, by component(s) of vehicle system 120, of a scan of information representing the object, e.g., a barcode, an RFID tag, an NFC tag, a label, etc. associated with the object.

At 1620, cloud-based computing component 1520 can determine characteristic(s), e.g., dimension(s), etc. associated with the object based on the image data, e.g., utilizing cloud-based data store 420. At 1630, cloud-based computing component 1520 can send the characteristic(s) associated with the object directed to vehicle system 120.

Figure 17:
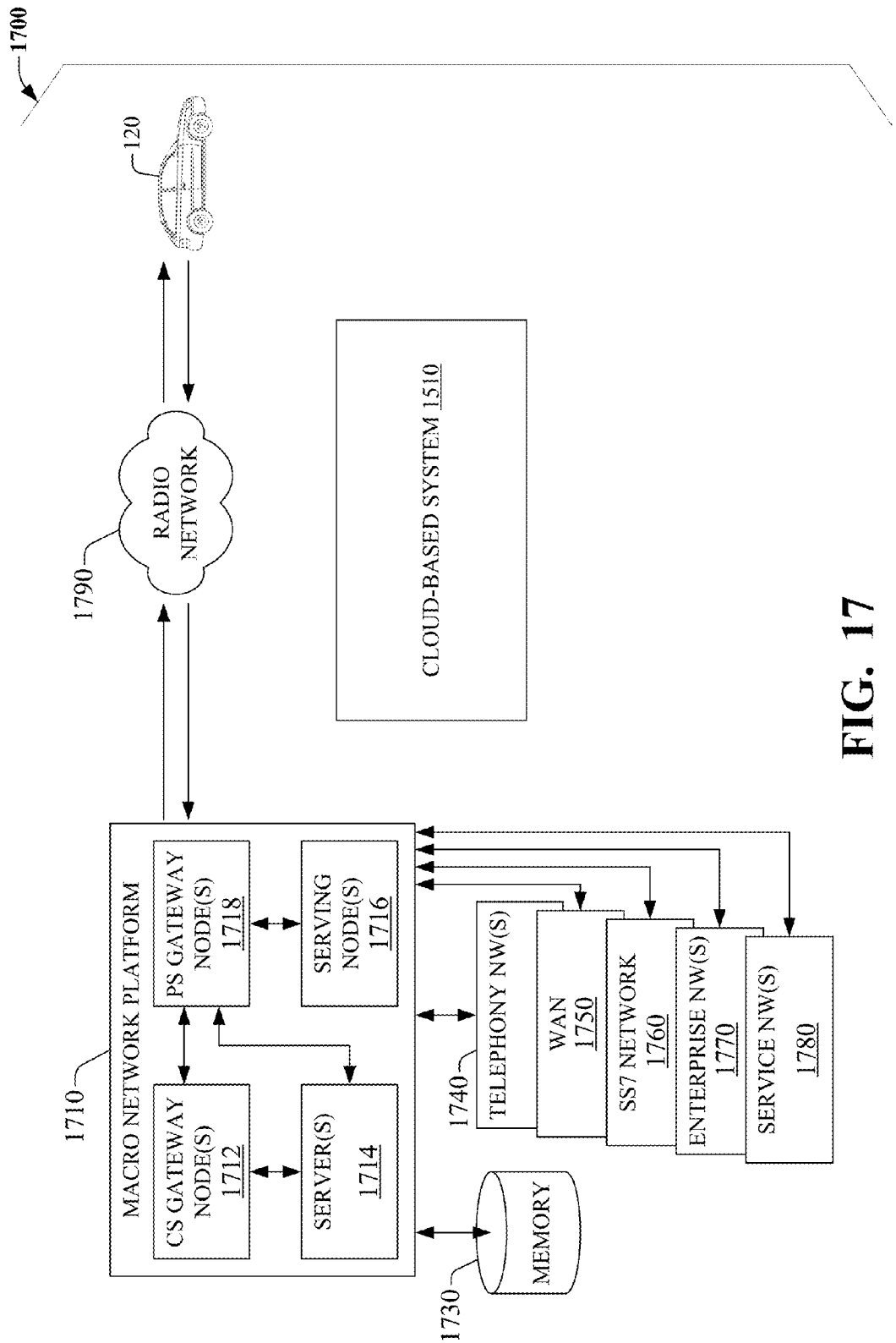
FIG. 17 illustrates a wireless communication environment, in accordance with various embodiments.

With respect to FIG. 17, a wireless communication environment 1700 including vehicle system 120, cloud-based system 1510, and macro network platform 1710 is illustrated, in accordance with an embodiment. Macro network platform 1710 serves or facilitates communication with vehicle system 120. It should be appreciated that in cellular wireless technologies that can be associated with radio network 1790 (e.g., 3GPP UMTS, HSPA, 3GPP LTE, 3GPP2 UMB), macro network platform 1710 can be embodied in a core network, e.g., core network 106. It is noted that radio network 1790 can include base station(s), base transceiver station(s), or access point(s), and associated electronic circuitry and deployment site(s), in addition to a wireless radio link operated in accordance with the base station(s). Accordingly, radio network 1790 can comprise various coverage cells, or wireless coverage areas. In addition, it should be appreciated that elements and/or components of cloud-based system 1510 can be located/included within one or more components/elements, e.g., hardware, software, etc., of wireless communication environment 1700, e.g., macro network platform 1710, radio network 1790, etc.

Generally, macro platform 1710 includes components, e.g., nodes, gateways, interfaces, servers, or platforms that facilitate both packet-switched (PS), e.g., internet protocol (IP), frame relay, asynchronous transfer mode (ATM), and circuit-switched (CS) traffic, e.g., voice and data, and control generation for networked wireless communication, e.g., via vehicle system 120. In an aspect of the subject innovation, macro network platform 1710 includes CS gateway node(s) 1712 which can interface CS traffic received from legacy networks like telephony network(s) 1740, e.g., public switched telephone network (PSTN), or public land mobile network (PLMN), or a SS7 network 1760. Circuit switched gateway 1712 can authorize and authenticate traffic, e.g., voice, arising from such networks. Additionally, CS gateway 1712 can access mobility or roaming data generated through SS7 network 1760; for instance, mobility data stored in a visitor location register (VLR), which can reside in memory 1730. Moreover, CS gateway node(s) 1712 interfaces CS-based traffic and signaling and gateway node(s) 1718. As an example, in a 3GPP UMTS network, PS gateway node(s) 1718 can be embodied in gateway GPRS support node(s) (GGSN).

In addition to receiving and processing CS-switched traffic and signaling, PS gateway node(s) 1718 can authorize and authenticate PS-based data sessions with served, e.g., through macro RAN, wireless devices. Data sessions can include traffic exchange with networks external to the macro network platform 1710, like wide area network(s) (WANs) 1750; enterprise networks (NWs) 1770, e.g., enhanced 911, or service NW(s) 1780 like IP multimedia subsystem (IMS). It should be appreciated that local area network(s) (LANs), which may be a part of enterprise NW(s), can also be interfaced with macro network platform 1710 through PS gateway node(s) 1718. Packet-switched gateway node(s) 1718 generates packet data contexts when a data session is established. To that end, in an aspect, PS gateway node(s)

1718 can include a tunnel interface, e.g., tunnel termination gateway (TTG) in 3GPP UMTS network(s) (not shown), which can facilitate packetized communication with disparate wireless network(s), such as Wi-Fi networks. It should be further appreciated that the packetized communication can include multiple flows that can be generated through server(s) 1714. It is to be noted that in 3GPP UMTS network(s), PS gateway node(s) 1718 (e.g., GGSN) and tunnel interface (e.g., TTG) comprise a packet data gateway (PDG).

Macro network platform 1710 also includes serving node(s) 1716 that can convey the various packetized flows of information, or data streams, received through PS gateway node(s) 1718. As an example, in a 3GPP UMTS network, serving node(s) can be embodied in serving GPRS support node(s) (SGSN).

As indicated above, server(s) 1714 in macro network platform 1710 can execute numerous applications, e.g., messaging, location services, online gaming, wireless banking, wireless device management, etc. that can generate multiple disparate packetized data streams or flows; and can manage such flows, e.g., schedule, queue, format. Such application(s), for example can include add-on features to standard services provided by macro network platform 1710. Data streams can be conveyed to PS gateway node(s) 1718 for authorization/authentication and initiation of a data session, and to serving node(s) 1716 for communication thereafter. Server(s) 1714 can also effect security, e.g., implement one or more firewalls, of macro network platform 1710 to ensure network's operation and data integrity in addition to authorization and authentication procedures that CS gateway node(s) 1712 and PS gateway node(s) 1718 can enact. Moreover, server(s) 1714 can provision services from external network(s), e.g., WAN 1750, or Global Positioning System (GPS) network(s), which can be a part of enterprise NW(s) 1780. It is to be noted that server(s) 1714 can include one or more processors configured to confer at least in part the functionality of macro network platform 1710. To that end, the one or more processors can execute code instructions stored in memory 1730, for example.

In example wireless communication environment 1700, memory 1730 stores information related to operation of macro network platform 1710 and vehicle system 120. Information can include manufacturing data, etc. associated with components of vehicle system 120, e.g., specifying characteristic(s) of vehicle system 120, etc.; business data associated with subscribers; market plans and strategies, e.g., promotional campaigns, business partnerships; operational data for mobile devices served through macro network platform; service and privacy policies; end-user service logs for law enforcement; term(s) and/or condition(s) associated with wireless service(s) provided via radio network 1790; and so forth. Memory 1730 can also store information from at least one of telephony network(s) 1740, WAN 1750, SS7 network 1760, enterprise NW(s) 1770, or service NW(s) 1780.

As it employed in the subject specification, the term "processor" can refer to substantially any computing processing unit or device comprising, but not limited to comprising, single-core processors; single-processors with software multithread execution capability; multi-core processors; multi-core processors with software multithread execution capability; multi-core processors with hardware multithread technology; parallel platforms; and parallel platforms with distributed shared memory. Additionally, a processor can refer to an integrated circuit, an application specific integrated circuit (ASIC), a digital signal processor (DSP), a field programmable gate array (FPGA), a programmable logic controller (PLC), a complex programmable logic device (CPLD), a discrete gate or transistor logic, discrete hardware components, or any combination thereof designed to perform the functions and/or processes described herein. Processors can exploit nano-scale architectures such as, but not limited to, molecular and quantum-dot based transistors, switches and gates, in order to optimize space usage or enhance performance of mobile devices. A processor may also be implemented as a combination of computing processing units.

In the subject specification, terms such as "store," "data store," data storage," "database," and substantially any other information storage component relevant to operation and functionality of a component and/or process, refer to "memory components," or entities embodied in a "memory," or components comprising the memory. It will be appreciated that the memory components described herein can be either volatile memory or nonvolatile memory, or can include both volatile and nonvolatile memory.

By way of illustration, and not limitation, nonvolatile memory, for example, can be included in non-volatile memory 1822 (see below), disk storage 1824 (see below), and/or memory storage 1846 (see below). Further, nonvolatile memory can be included in read only memory (ROM), programmable ROM (PROM), electrically programmable ROM (EPROM), electrically erasable ROM (EEPROM), or flash memory. Volatile memory 1820 can include random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM). Additionally, the disclosed memory components of systems or methods herein are intended to comprise, without being limited to comprising, these and any other suitable types of memory.

Figure 18:
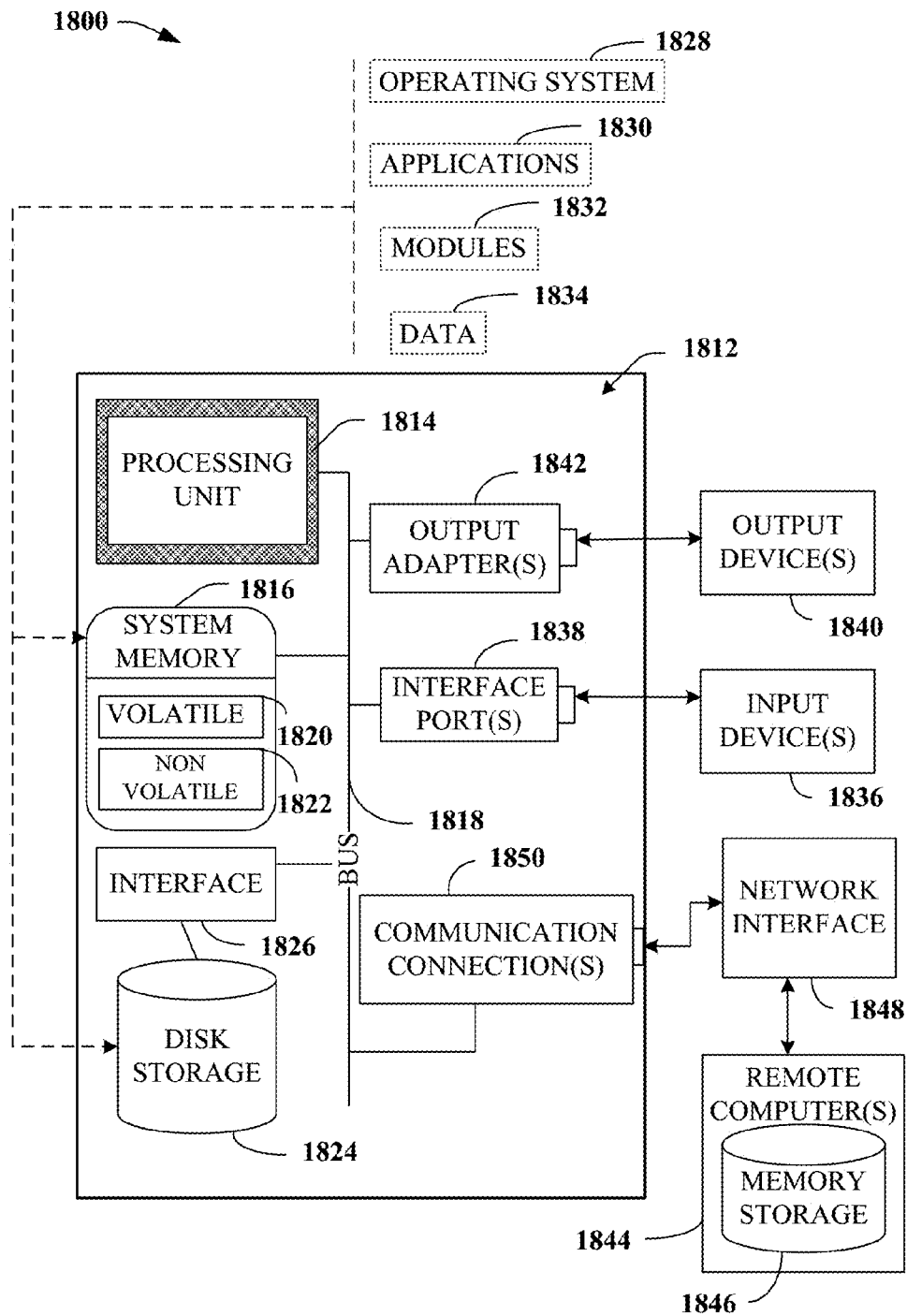
FIG. 18 illustrates a block diagram of a computing system operable to execute the disclosed systems, methods and apparatus, in accordance with various embodiments.

In order to provide a context for the various aspects of the disclosed subject matter, FIG. 18, and the following discussion, are intended to provide a brief, general description of a suitable environment in which the various aspects of the disclosed subject matter can be implemented. While the subject matter has been described above in the general context of computer-executable instructions of a computer program that runs on a computer and/or computers, those skilled in the art will recognize that the subject innovation also can be implemented in combination with other program modules. Generally, program modules include routines, programs, components, data structures, etc. that perform particular tasks and/or implement particular abstract data types.

Moreover, those skilled in the art will appreciate that the inventive systems can be practiced with other computer system configurations, including single-processor or multi-processor computer systems, mini-computing devices, mainframe computers, as well as personal computers, hand-held computing devices (e.g., PDA, phone, watch), microprocessor-based or programmable consumer or industrial electronics, and the like. The illustrated aspects can also be practiced in distributed computing environments where tasks are performed by remote processing devices that are linked through a communications network; however, some if not all aspects of the subject disclosure can be practiced on stand-alone computers. In a distributed computing environment, program modules can be located in both local and remote memory storage devices.

With reference to FIG. 18, a block diagram of a computing system 1800 operable to execute the disclosed systems and methods is illustrated, in accordance with an embodiment. Computer 1812 includes a processing unit 1814, a system memory 1816, and a system bus 1818. System bus 1818 couples system components including, but not limited to, system memory 1816 to processing unit 1814. Processing unit 1814 can be any of various available processors. Dual microprocessors and other multiprocessor architectures also can be employed as processing unit 1814.

System bus 1818 can be any of several types of bus structure(s) including a memory bus or a memory controller, a peripheral bus or an external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCMCIA), Firewire (IEEE 1394), Small Computer Systems Interface (SCSI), and/or controller area network (CAN) bus used in vehicles.

System memory 1816 includes volatile memory 1820 and nonvolatile memory 1822. A basic input/output system (BIOS), containing routines to transfer information between elements within computer 1812, such as during start-up, can be stored in nonvolatile memory 1822. By way of illustration, and not limitation, nonvolatile memory 1822 can include ROM, PROM, EPROM, EEPROM, or flash memory. Volatile memory 1820 includes RAM, which acts as external cache memory. By way of illustration and not limitation, RAM is available in many forms such as SRAM, dynamic RAM (DRAM), synchronous DRAM (SDRAM), double data rate SDRAM (DDR SDRAM), enhanced SDRAM (ESDRAM), Synchlink DRAM (SLDRAM), Rambus direct RAM (RDRAM), direct Rambus dynamic RAM (DRDRAM), and Rambus dynamic RAM (RDRAM).

Computer 1812 also includes removable/non-removable, volatile/non-volatile computer storage media. FIG. 18 illustrates, for example, disk storage 1824. Disk storage 1824 includes, but is not limited to, devices like a magnetic disk drive, floppy disk drive, tape drive, Jaz drive, Zip drive, LS-100 drive, flash memory card, or memory stick. In addition, disk storage 1824 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 1824 to system bus 1818, a removable or non-removable interface is typically used, such as interface 1826.

It is to be appreciated that FIG. 18 describes software that acts as an intermediary between users and computer resources described in suitable operating environment 1800. Such software includes an operating system 1828. Operating system 1828, which can be stored on disk storage 1824, acts to control and allocate resources of computer system 1812. System applications 1830 take advantage of the management of resources by operating system 1828 through program modules 1832 and program data 1834 stored either in system memory 1816 or on disk storage 1824. It is to be appreciated that the disclosed subject matter can be implemented with various operating systems or combinations of operating systems.

A user can enter commands or information into computer 1812 through input device(s) 1836. Input devices 1836 include, but are not limited to, a pointing device such as a mouse, trackball, stylus, touch pad, keyboard, microphone, joystick, game pad, satellite dish, scanner, TV tuner card, digital camera, digital video camera, web camera, cellular phone, user equipment, smartphone, and the like. These and other input devices connect to processing unit 1814 through system bus 1818 via interface port(s) 1838. Interface port(s) 1838 include, for example, a serial port, a parallel port, a game port, a universal serial bus (USB), a wireless based port, e.g., WiFi, Bluetooth®, etc. Output device(s) 1840 use some of the same type of ports as input device(s) 1836.

Thus, for example, a USB port can be used to provide input to computer 1812 and to output information from computer 1812 to an output device 1840. Output adapter 1842 is provided to illustrate that there are some output devices 1840, e.g., associated with notification component 510, like monitors, speakers, and printers, among other output devices 1840, which use special adapters. Output adapters 1842 include, by way of illustration and not limitation, video and sound devices, cards, etc. that provide means of connection between output device 1840 and system bus 1818. It should be noted that other devices and/or systems of devices provide both input and output capabilities such as remote computer(s) 1844.

Computer 1812 can operate in a networked environment using logical connections to one or more remote computers, such as remote computer(s) 1844. Remote computer(s) 1844 can be a personal computer, a server, a router, a network PC, a workstation, a microprocessor based appliance, a peer device, or other common network node and the like, and typically includes many or all of the elements described relative to computer 1812.

For purposes of brevity, only a memory storage device 1846 is illustrated with remote computer(s) 1844. Remote computer(s) 1844 is logically connected to computer 1812 through a network interface 1848 and then physically connected via communication connection 1850. Network interface 1848 encompasses wire and/or wireless communication networks such as local-area networks (LAN) and wide-area networks (WAN). LAN technologies include Fiber Distributed Data Interface (FDDI), Copper Distributed Data Interface (CDDI), Ethernet, Token Ring and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 1850 refer(s) to hardware/software employed to connect network interface 1848 to bus 1818. While communication connection 1850 is shown for illustrative clarity inside computer 1812, it can also be external to computer 1812. The hardware/software for connection to network interface 1848 can include, for example, internal and external technologies such as modems, including regular telephone grade modems, cable modems and DSL modems, ISDN adapters, and Ethernet cards.

The computer 1812 can operate in a networked environment using logical connections via wired and/or wireless communications to one or more remote computers, cellular based devices, user equipment, smartphones, or other computing devices, such as workstations, server computers, routers, personal computers, portable computers, microprocessor-based entertainment appliances, peer devices or other common network nodes, etc. The computer 1812 can connect to other devices/networks by way of antenna, port, network interface adaptor, wireless access point, modem, and/or the like.

The computer 1812 is operable to communicate with any wireless devices or entities operatively disposed in wireless communication, e.g., a printer, scanner, desktop and/or portable computer, portable data assistant, communications satellite, user equipment, cellular base device, smartphone, any piece of equipment or location associated with a wirelessly detectable tag (e.g., scanner, a kiosk, news stand, restroom), and telephone. This includes at least WiFi and Bluetooth® wireless technologies. Thus, the communication can be a predefined structure as with a conventional network or simply an ad hoc communication between at least two devices.

WiFi allows connection to the Internet from a desired location (e.g., a vehicle, couch at home, a bed in a hotel room, or a conference room at work, etc.) without wires. WiFi is a wireless technology similar to that used in a cell phone that enables such devices, e.g., mobile phones, computers, etc., to send and receive data indoors and out, anywhere within the range of a base station. WiFi networks use radio technologies called IEEE 802.11 (a, b, g, etc.) to provide secure, reliable, fast wireless connectivity. A WiFi network can be used to connect communication devices (e.g., mobile phones, computers, etc.) to each other, to the Internet, and to wired networks (which use IEEE 802.3 or Ethernet). WiFi networks operate in the unlicensed 2.4 and 5 GHz radio bands, at an 11 Mbps (802.11a) or 54 Mbps (802.11b) data rate, for example, or with products that contain both bands (dual band), so the networks can provide real-world performance similar to the basic 10BaseT wired Ethernet networks used in many offices.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

What is claimed is:

1. A method comprising:
   receiving, by a system comprising a processor via a sensor component, data representing at least one characteristic of a first object, the system and the sensor component being included in a vehicle including storage space;
   detecting, by the system via the sensor component, that the first object has been removed from the storage space of the vehicle;
   determining, by the system, that the data representing the at least one characteristic of the first object indicates an increase in the storage space of the vehicle based on detecting the first object has been removed from the storage space;
   receiving, by the system via the sensor component, data representing at least one characteristic of a second object, the second object being included in the storage space of the vehicle;
   determining, by the system, that the data representing the at least one characteristic of the second object indicates a probability of a movement of the second object in the storage space; and
   sending, by the system, a message directed to a device comprising a warning indicating the probability of the movement of the second object within the storage space.

2. The method of claim 1, wherein the detecting comprises detecting the first object has been removed from the storage space utilizing a camera.

3. The method of claim 1, wherein the method further comprises:
   sending a query directed to a cloud-based storage device, wherein the query comprises a request to receive the data representing the at least one characteristic of the second object.

4. The method of claim 1, wherein the determining that the data representing the at least one characteristic of the second object indicates a probability of a movement of the second object in the storage space comprises:
   correlating an identifier of the second object with the at least one characteristic of the second object.

5. The method of claim 4, wherein the correlating comprises associating the identifier of the second object with a center of gravity of the second object.

6. The method of claim 1, wherein the movement of the second object in the storage space comprises at least one of a tilt or a roll of the second object within the storage space.

7. A system comprising:
   a processor;
   a sensor component; and
   a memory that stores executable instructions that, when executed by the processor, facilitate performance of operations, comprising:
      receiving, via the sensor component, data representing at least one characteristic of a first object, the sensor component being included in a vehicle including a storage area;
      detecting, via the sensor component, a removal of the first object from the storage area of the vehicle;
      determining that the data representing the at least one characteristic of the first object indicates an increase in the storage area of the vehicle based on detecting the removal of the first object from the storage area;
      receiving, via the sensor component, data representing at least one characteristic of a second object, the second object being included in the storage area of the vehicle;
      determining that the data representing the at least one characteristic of the second object indicates a probability of a movement of the second object in the storage area; and
      sending, to a wireless device, a message comprising a warning indicating the probability of the movement of the second object within the storage area.

8. The system of claim 7, wherein the operations further comprise:
   determining dimensions representing an available storage capacity of the vehicle based on the detected removal of the first object from the storage area of the vehicle.

9. The system of claim 8, wherein the operations further comprise:
　　based on the dimensions representing the available storage capacity, determining whether a third object is capable of being placed within the storage area of the vehicle.

10. The system of claim 9, wherein the operations further comprise:
　　determining a reconfiguration of a component of the storage area for placement of the third object within a reconfigured portion of the storage area based on determining that the third object is not capable of being placed within the storage area of the vehicle.

11. The system of claim 10, wherein the operations further comprise:
　　sending a message directed to a mobile device representing the reconfiguration.

12. The system of claim 7, wherein determining that the data representing the at least one characteristic of the second object indicates a probability of a movement of the second object in the storage area is based, at least in part, on image data representing the storage area of the vehicle.

13. The system of claim 7, wherein determining that the data representing the at least one characteristic of the second object indicates a probability of a movement of the second object in the storage area comprises:
　　associating, via a data store, an identifier representing the second object with the at least one characteristic of the second object.

14. The system of claim 13, wherein the at least one characteristic of the second object comprises a center of gravity of the second object.

15. The system of claim 13, wherein movement of the second object in the storage area comprises at least one of a roll or a tilt of the second object within the storage area.

16. A non-transitory machine-readable storage medium, comprising executable instructions that, when executed by a processor, facilitate performance of operations, comprising:
　　receiving, via a sensor component, data representing at least one characteristic of a first object, the sensor component being included in a vehicle including a storage area;
　　detecting, via the sensor component, that the first object has been removed from the storage area of the vehicle;
　　determining that the data representing the at least one characteristic of the first object indicates an increase in the storage area of the vehicle based on detecting the first object has been removed from the storage area;
　　receiving, via the sensor component, data representing at least one characteristic of a second object, the second object being included in the storage area of the vehicle;
　　determining that the data representing the at least one characteristic of the second object indicates a probability of a movement of the second object in the storage area; and
　　sending to a wireless device, a message comprising a warning indicating the probability of the movement of the second object within the storage area.

17. The non-transitory machine-readable storage medium of claim 16, wherein the operations further comprise:
　　determining an available storage capacity of the vehicle based on detecting the first object has been removed from the storage area.

18. The non-transitory machine-readable storage medium of claim 17, wherein the operations further comprise:
　　based on the available storage capacity, determining whether a third object is capable of being placed within the storage area of the vehicle.

19. The method of claim 1, wherein the sensor component comprises an imaging device configured to examine the at least one characteristic of the first object and the at least one characteristic of the second object.

20. The system of claim 7, wherein the sensor component comprises an imaging device configured to examine the at least one characteristic of the first object and the at least one characteristic of the second object.

* * * * *

UNITED STATES PATENT AND TRADEMARK OFFICE
CERTIFICATE OF CORRECTION

PATENT NO. : 10,387,982 B2
APPLICATION NO. : 15/475071
DATED : August 20, 2019
INVENTOR(S) : Christopher Baldwin It is certified that error appears in the above-identified patent and that said Letters Patent is hereby corrected as shown below:

On the Title Page

Column 2, item (74), Attorney, Agent or Firm, Line 1, delete "FishBroyles" and insert
-- FisherBroyles --, therefor.

In the Claims

In Column 22, Line 17, Claim 16, delete "sending" and insert -- sending, --, therefor.

Signed and Sealed this
Twenty-sixth Day of November, 2019

Andrei Iancu
*Director of the United States Patent and Trademark Office*